(12) United States Patent
Yu et al.

(10) Patent No.: US 12,550,793 B2
(45) Date of Patent: *Feb. 10, 2026

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Yung-Chi Lin, Su-Lin (TW); Wen-Chih Chiou, Zhunan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 83 days.

This patent is subject to a terminal disclaimer.

(21) Appl. No.: 18/518,187

(22) Filed: Nov. 22, 2023

(65) Prior Publication Data

US 2024/0088123 A1 Mar. 14, 2024

Related U.S. Application Data

(63) Continuation of application No. 17/884,096, filed on Aug. 9, 2022, now Pat. No. 11,855,067, which is a (Continued)

(51) Int. Cl.
H01L 25/00 (2006.01)
H01L 23/00 (2006.01)
(Continued)

(52) U.S. Cl.
CPC .............. *H01L 25/50* (2013.01); *H01L 24/33* (2013.01); *H01L 24/83* (2013.01); *H01L 24/92* (2013.01);
(Continued)

(58) Field of Classification Search
CPC ..... H01L 25/50; H01L 25/18; H01L 25/0657; H01L 24/33; H01L 24/83; H01L 24/92;
(Continued)

(56) References Cited

U.S. PATENT DOCUMENTS

| 9,000,584 B2 | 4/2015 | Lin et al. |
| 9,048,222 B2 | 6/2015 | Hung et al. |

(Continued)

FOREIGN PATENT DOCUMENTS

| KR | 20200037051 A | 4/2020 |
| TW | 202013658 A | 4/2020 |

*Primary Examiner* — Jasmine J Clark
(74) *Attorney, Agent, or Firm* — Slater Matsil, LLP

(57) ABSTRACT

A device package includes a first die directly bonded to a second die at an interface, wherein the interface comprises a conductor-to-conductor bond. The device package further includes an encapsulant surrounding the first die and the second die and a plurality of through vias extending through the encapsulant. The plurality of through vias are disposed adjacent the first die and the second die. The device package further includes a plurality of thermal vias extending through the encapsulant and a redistribution structure electrically connected to the first die, the second die, and the plurality of through vias. The plurality of thermal vias is disposed on a surface of the second die and adjacent the first die.

20 Claims, 31 Drawing Sheets

Related U.S. Application Data continuation of application No. 16/934,870, filed on Jul. 21, 2020, now Pat. No. 11,502,072.

(60) Provisional application No. 63/010,849, filed on Apr. 16, 2020.

(51) Int. Cl.
*H01L 25/065* (2023.01)
*H01L 25/18* (2023.01)

(52) U.S. Cl.
CPC .......... *H01L 25/0657* (2013.01); *H01L 25/18* (2013.01); *H01L 2224/08146* (2013.01); *H01L 2224/33181* (2013.01); *H01L 2224/33505* (2013.01); *H01L 2224/33519* (2013.01); *H01L 2224/80006* (2013.01); *H01L 2224/8083* (2013.01); *H01L 2224/83005* (2013.01); *H01L 2224/8383* (2013.01); *H01L 2224/83896* (2013.01); *H01L 2224/92142* (2013.01); *H01L 2225/06541* (2013.01); *H01L 2225/06589* (2013.01)

(58) Field of Classification Search
CPC . H01L 2224/08146; H01L 2224/33181; H01L 2224/33505; H01L 2224/33519; H01L 2224/80006; H01L 2224/8083; H01L 2224/83005; H01L 2224/8383; H10B 80/00
USPC .................................................. 257/621, 777
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,502,072 B2 | 11/2022 | Yu et al. |
| 11,855,067 B2 * | 12/2023 | Yu .......................... H01L 25/18 |
| 2010/0244208 A1 | 9/2010 | Pagaila et al. |
| 2013/0082372 A1 | 4/2013 | Lin et al. |
| 2020/0006164 A1 | 1/2020 | Yu et al. |
| 2020/0105635 A1 | 4/2020 | Yu et al. |
| 2021/0098423 A1 | 4/2021 | Chen et al. |

* cited by examiner

INTEGRATED CIRCUIT PACKAGE AND METHOD

CROSS-REFERENCE TO RELATED APPLICATIONS

This application is a continuation of U.S. application Ser. No. 17/884,096, filed on Aug. 9, 2022, now U.S. Pat. No. 11,855,067, issued on Dec. 26, 2023, which is a continuation of U.S. application Ser. No. 16/934,870, filed on Jul. 21, 2020, now U.S. Pat. No. 11,502,072, issued on Nov. 15, 2022, which claims the benefit of U.S. Provisional Application No. 63/010,849, filed on Apr. 16, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
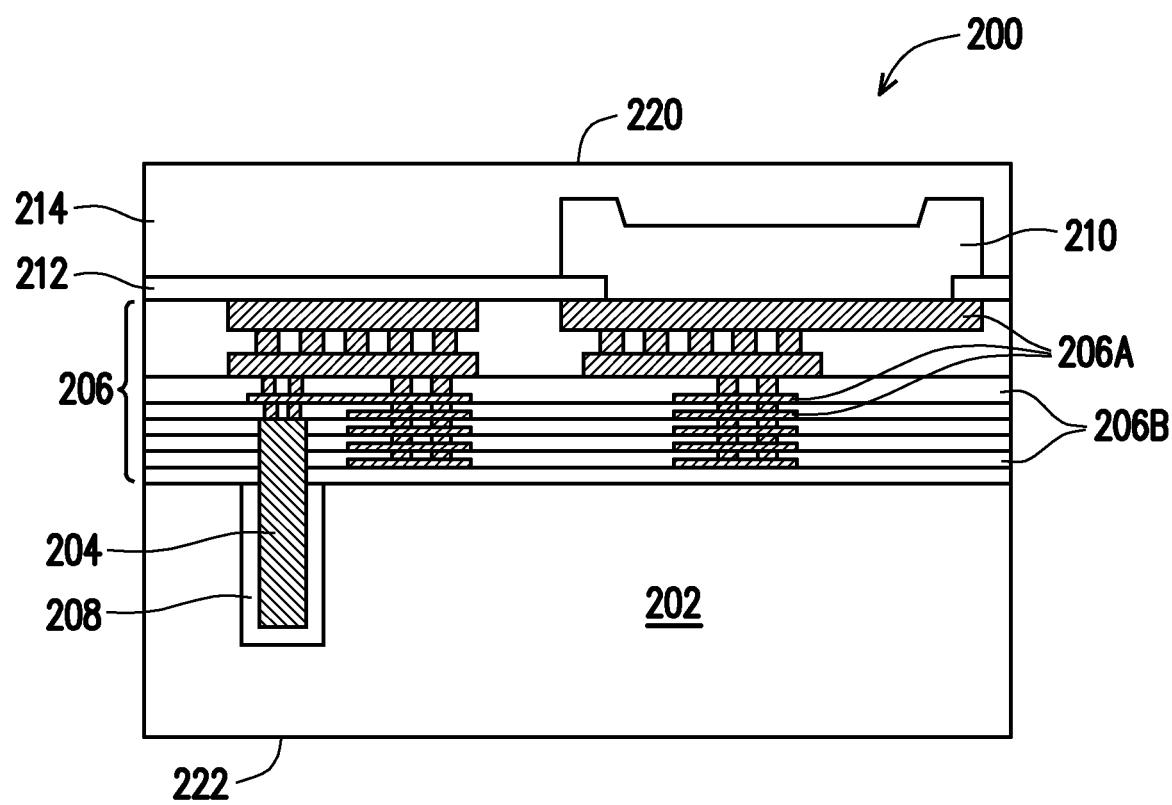
FIGS. 1A through 1M illustrate cross-sectional views of intermediate steps of manufacturing a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, stacked dies (e.g., a first die bonded to a second die) are encapsulated in an insulating material, and a heat dissipation structure (e.g., a substrate) is bonded to a backside of the second die and the insulating material. In some embodiments, the heat dissipation structure is a semiconductor substrate that is bonded using metal-to-metal bonding, which improves the heat dissipation in the completed package and improves adhesion between the heat dissipation structure and the second die. In other embodiments, the heat dissipation structure is bonded using another bonding configuration (e.g., dielectric-to-dielectric bonding, semiconductor-to-semiconductor bonding, or the like).

FIGS. 1A through 1M are cross-sectional views of intermediate steps of a process for forming a semiconductor package 400 (see FIG. 1M) in accordance with some embodiments.

Referring to FIG. 1A, a semiconductor die 200 is illustrated. The die 200 may be a bare chip semiconductor die (e.g., unpackaged semiconductor die). For example, the die 200 may be logic dies (e.g., application processors (APs), central processing units, microcontrollers, etc.), memory dies (e.g., dynamic random access memory (DRAM) dies, hybrid memory cubes (HBCs), static random access memory (SRAM) dies, a wide input/output (wideIO) memory dies, magnetoresistive random access memory (mRAM) dies, resistive random access memory (rRAM) dies, etc.), power management dies (e.g., power management integrated circuit (PMIC) dies), radio frequency (RF)

dies, sensor dies, micro-electro-mechanical-system (MEMS) dies, signal processing dies (e.g., digital signal processing (DSP) dies), front-end dies (e.g., analog front-end (AFE) dies), biomedical dies, or the like.

The die 200 may be processed according to applicable manufacturing processes to form integrated circuits in the die 200. For example, the die 200 may include a semiconductor substrate 202, such as silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Devices, such as transistors, diodes, capacitors, resistors, etc., may be formed in and/or on the semiconductor substrate 202 and may be interconnected by an interconnect structure 206 comprising, for example, metallization patterns 206A in one or more dielectric layers 206B on the semiconductor substrate 202. The interconnect structures 206 electrically connect the devices on the substrate 202 to form one or more integrated circuits.

The die 200 each further include through vias 204, which may be electrically connected to the metallization patterns in the interconnect structure 206. The through vias 204 may comprise a conductive material (e.g., copper, or the like) and may extend from the interconnect structure 206 into the substrate 202. Insulating barrier layers 208 may be formed around at least portions of the through vias 204 in the substrates 202. The insulating barrier layers 208 may comprise, for example, silicon oxide, silicon nitride, silicon oxynitride, or the like, and may be used to physically and electrically isolate the through vias 204 from the substrates 202. In subsequent processing steps, the substrate 202 may be thinned to expose the through vias 204 (see FIG. 1C). After thinning, the through vias 204 provide electrical connection from a back side of the substrate 202 to a front side of the substrate 202.

The die 200 each further comprise contact pads 210, which allow external connections are made to the interconnect structure 206 and the devices on the substrate 202. The contact pads 210 may comprise copper, aluminum (e.g., 28K aluminum), or another conductive material. The contact pads 210 are disposed on what may be referred to as an active side or front side 220 of the dies 200. The active side/front side 220 of the dies 200 may refer to a side of the semiconductor substrate 202 on which the active devices are formed. The back side 222 of the dies 200 may refer to a side of the semiconductor substrate opposite the active side/front side.

A passivation film 212 is disposed on the interconnect structure 206, and the contact pads 210 are exposed at a top surface of the passivation film 212. The passivation film 212 may comprise silicon oxide, silicon oxynitride, silicon nitride, or the like. In some embodiments, the contact pads 210 may extend above a top surface of the passivation film 212.

The die 200 may be formed as part of a larger wafer (e.g., connected to other dies 200). In some embodiments, the dies 200 may be singulated from each other prior to packaging. The singulation process may include mechanical sawing, laser dicing, plasma dicing, combinations thereof, or the like. In other embodiments, the dies 200 are singulated after they are integrated into a semiconductor package. For example, the dies 200 may be packaged while still connected as part of a wafer.

In some embodiments, a chip probe (CP) test may be applied to each of the dies 200 (e.g., through the contact pads 210). The CP test checks electrical functionality of the dies 200, and dies that pass the CP tests are referred to as known good dies (KGDs). Dies 200 that do not pass the CP tests are discarded or repaired. In this manner, KGDs are provided for packaging, which reduces waste and expense of packaging a faulty die.

After the CP tests, a passivation layer 214 is formed over the contact pads 210 and the interconnect structure 206 of each KGD. The passivation layer 214 may comprise silicon oxide, silicon oxynitride, silicon nitride, or the like. The passivation layer 214 may protect the contact pads 210 during subsequent packaging processes as described here.

Figure 1B:
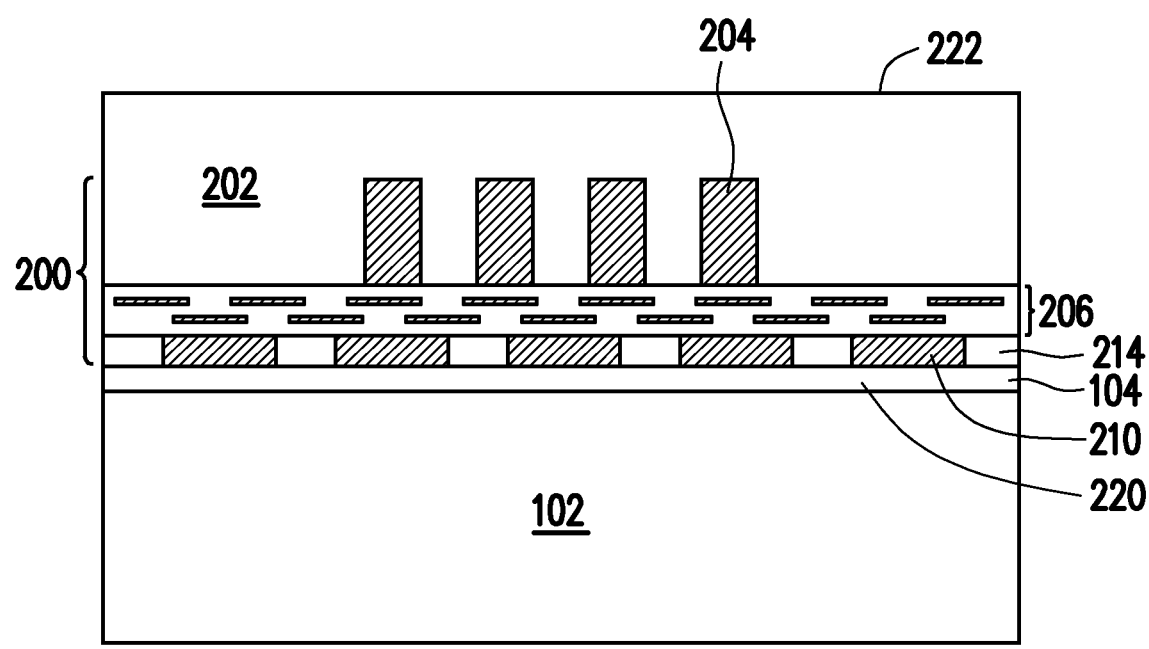

In FIG. 1B, the die 200 is attached face down to a carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. Although only a single die 200 is illustrated in FIG. 1B, multiple dies 200 may be attached to the carrier substrate 102 for simultaneous processing. The dies 200 may be attached to the carrier substrate 102 after singulation using a chip on wafer (CoW) process, or the dies 200 may be attached to the carrier substrate 102 prior to singulation using a wafer on wafer (WoW) process, for example. The dies 200 are disposed face down such that the front sides 220 of the dies 200 face the carrier substrate 102 and the back sides 222 of the dies 200 face away from the carrier substrate 102.

In some embodiments, the dies 200 are attached to the carrier substrate 102 by a release layer 106, and the passivation layer 214 of the dies 200 may contact the release layer 106. The release layer 106 may be formed of a polymer-based material, which may be removed along with the carrier substrate 102 from the dies 200 and other overlying structures that will be formed in subsequent steps. In some embodiments, the release layer 106 is an epoxy-based thermal-release material, which loses its adhesive property when heated, such as a light-to-heat-conversion (LTHC) release coating. In other embodiments, the release layer 106 may be an ultra-violet (UV) glue, which loses its adhesive property when exposed to UV lights. The release layer 106 may be dispensed as a liquid and cured, may be a laminate film laminated onto the carrier substrate 102, or may be the like. In other embodiments, the dies 200 may be fusion bonded directly to the carrier 102, for example, by fusion bonding the passivation layer 214 to the carrier 102. The fusion bonding may form a dielectric-to-semiconductor bond between the passivation layer 214 and the carrier 102. In such embodiments, the release layer 104 may be omitted.

Figure 1C:
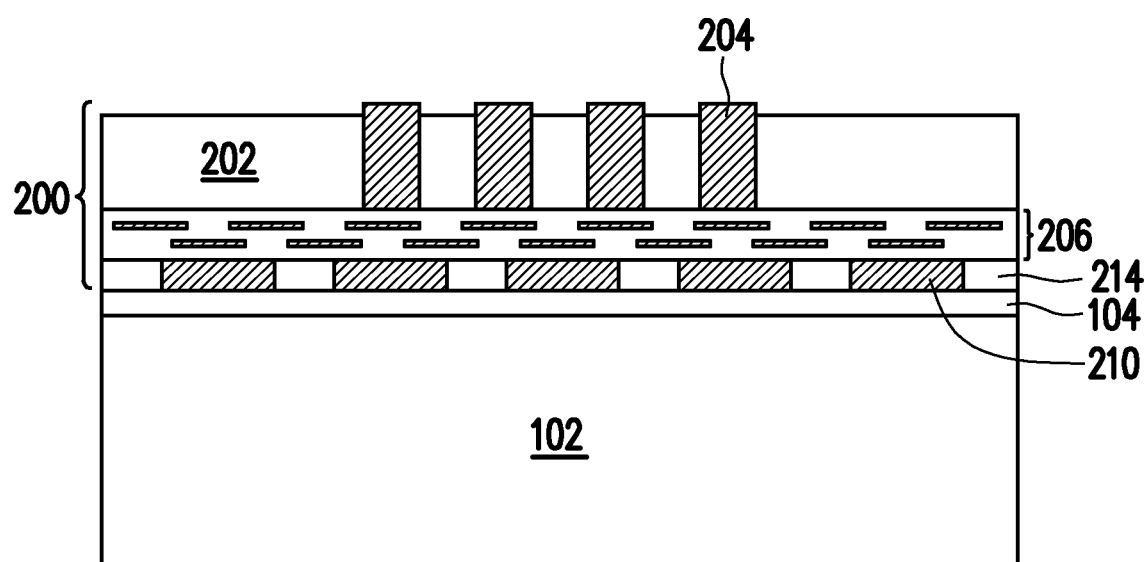

In FIG. 1C, a thinning process may be applied to the die 200 to expose the through vias 204. The thinning removes portions of the substrate 202 over the through vias 204. In some embodiments, the thinning may further remove lateral portions of a barrier layer (e.g., barrier layer 208, see FIG. 1A) on the through vias 204 to expose the through vias 204. The thinning process may comprise performing a chemical mechanical polish (CMP), grinding, an etch back (e.g., a wet etch), combinations thereof, or the like. In some embodiments, the thinning process may recess the substrate 202 such that the through vias 204 extend beyond a back surface of the substrate 202. This can be achieved, for example, through a selective etching process that selectively etches the substrate 202 without significantly etching the through vias 204.

Figure 1D:
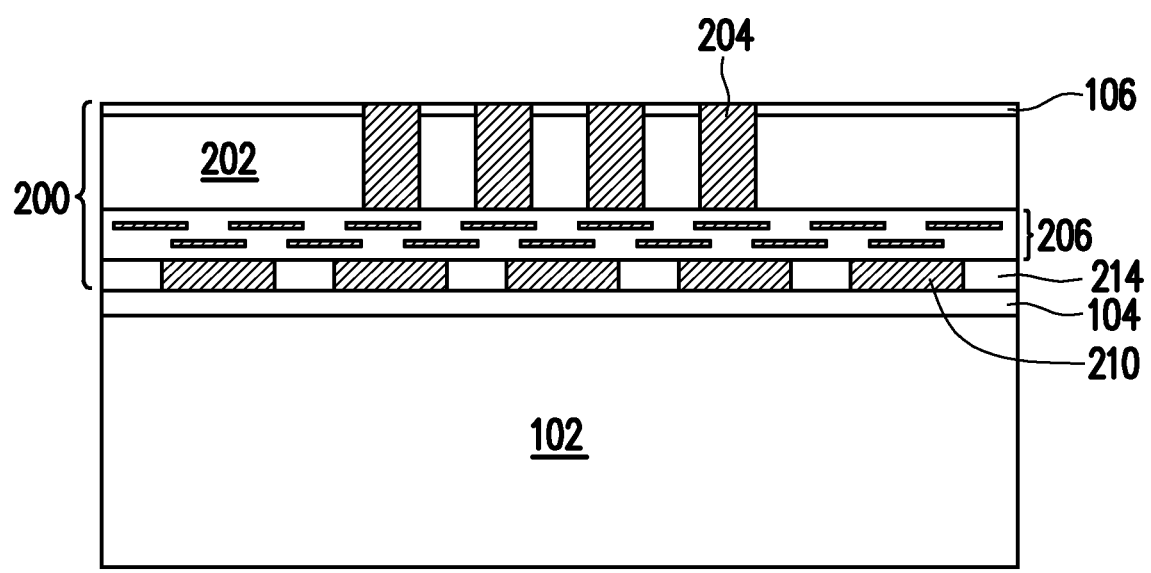

In FIG. 1D, a dielectric layer 106 is deposited over the substrate 202 and around portions of the through vias 204. For example, the dielectric layer 106 may be deposited around portions of the through vias 204 that extend above the substrate 202. The dielectric layer 106 may comprise silicon oxide, silicon nitride, silicon oxynitride, or the like, and the dielectric layer 106 may be deposited using a suitable deposition process such as chemical vapor deposition (CVD), physical vapor deposition (PVD), atomic layer deposition (ALD), or the like. The dielectric layer 106 may be deposited to initially cover the through vias 204. A planarization step may then be performed to substantially level surfaces of the through vias 204 and the dielectric layer 106.

Figure 1E:
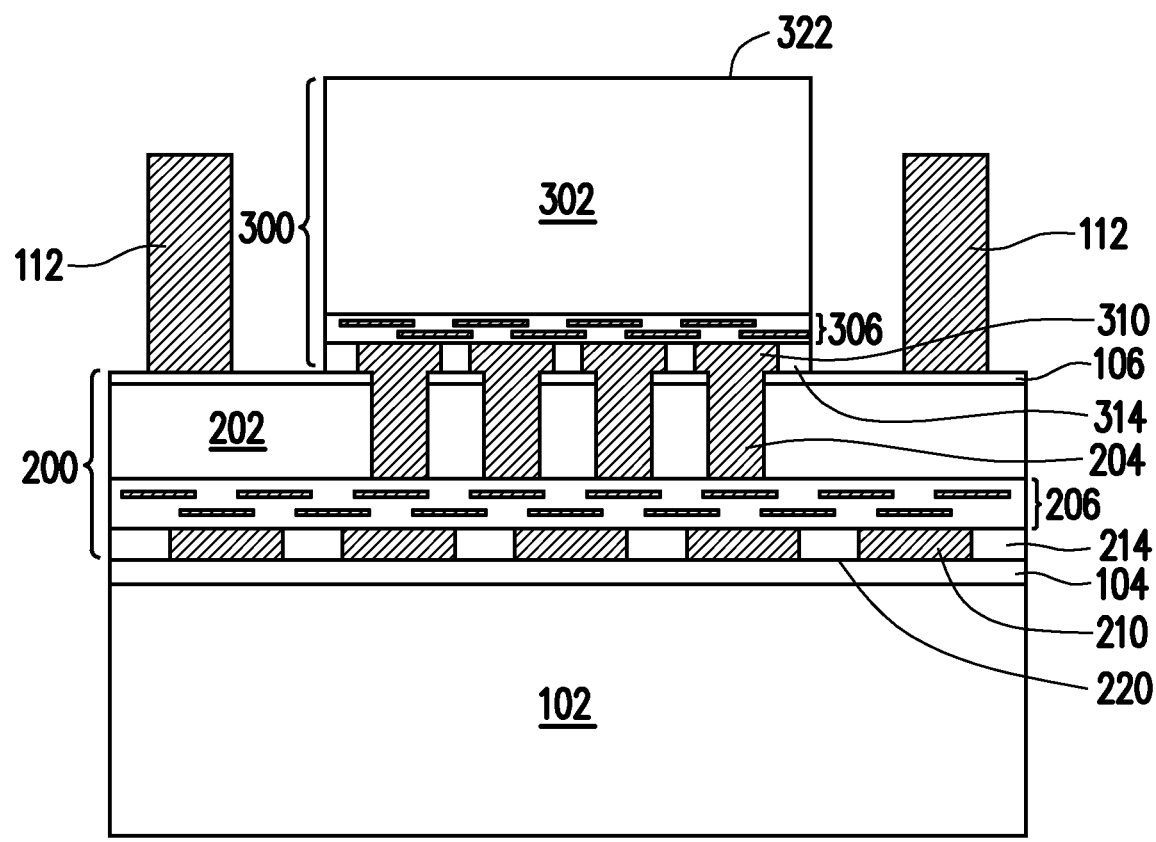
Figure 1F:
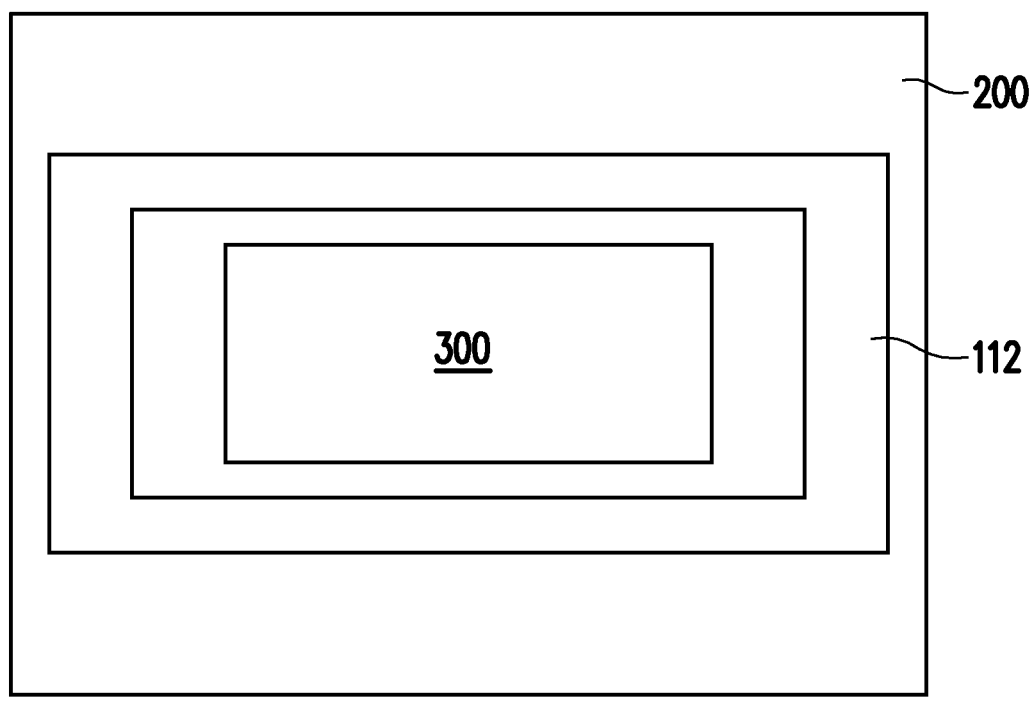
Figure 1G:
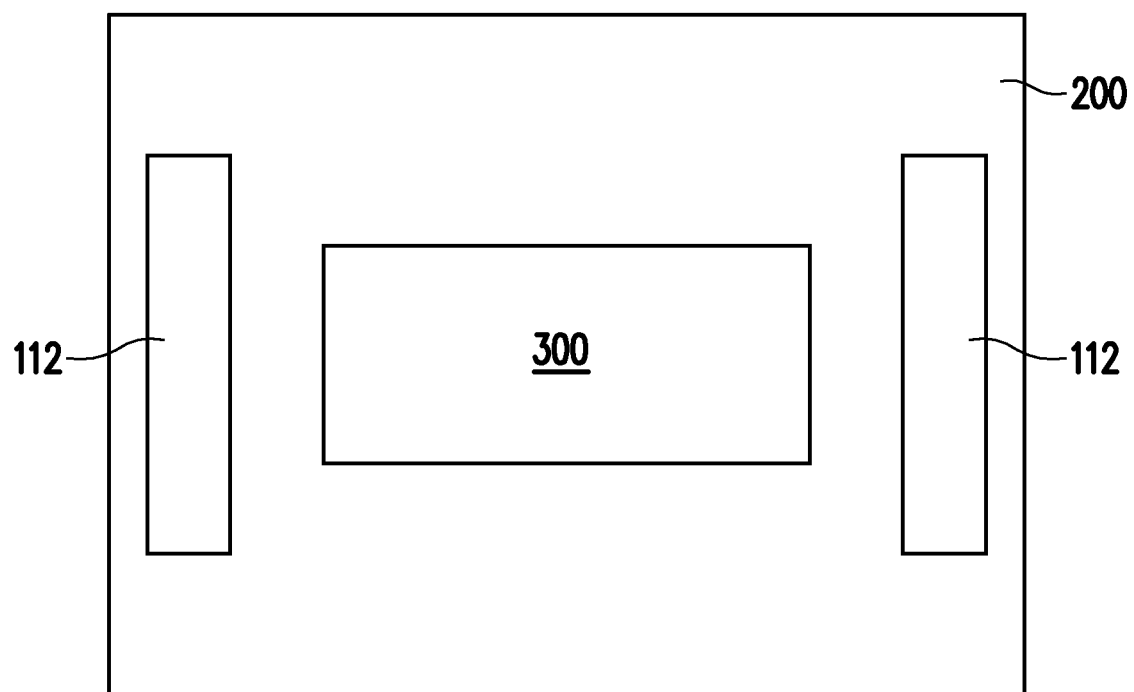

In FIG. 1E, dies 300 are bonded to the dies 200, for example, in a hybrid bonding configuration. The dies 300 may have a structure similar to what is described for the dies 200, and the details are not repeated herein. The materials and formation processes of the features in the dies 300 may be found by referring to the like features in the dies 200, with the like features in the dies 200 starting with number "2," which features correspond to the features in the dies 300 and having reference numerals starting with number "3." For example, the dies 300 may include a semiconductor substrate 302, an interconnect structure 306, and contact pads 310. In a specific embodiment, the dies 300 are memory dies, but other types of dies may be used as well.

The dies 300 are disposed face down such that the front sides 320 of the dies 300 face the dies 200 and the back sides 322 of the dies 300 face away from the dies 200. The dies 300 are bonded to the dielectric layer 106 on the back sides of the dies 200 and the through vias 204 in the dies 200. For example, a passivation layer of the dies 300 may be directly bonded to the dielectric layer 106, and contact pads 310 of the dies 300 may be directly bonded to the through vias 204. In an embodiment, the bond between the passivation layer 314 an oxide-to-oxide bond, or the like. The hybrid bonding process further directly bonds the contact pads 318 of the die 300 to the though vias 204 of the dies 200 through direct metal-to-metal bonding. Thus, electrical connection can between the dies 200 and 300 is provided by the physical connection of the contact pads 310 to the through vias 204.

As an example hybrid bonding process starts with aligning the dies 200 with the dies 300, for example, by applying a surface treatment to one or more of the dielectric layer 106 or the passivation layer 314. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the dielectric layer 106 or the passivation layer 314. The hybrid bonding process may then proceed to aligning the contact pads 310 to the through vias 204. When dies 200 and 300 are aligned, the contact pads 310 may overlap with the corresponding through vias 204. Next, the hybrid bonding includes a pre-bonding step, during which each die 200 is put in contact with a respective die 300. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in contact pads 310 (e.g., copper) and the metal of the though vias 204 (e.g., copper) inter-diffuses to each other, and hence the direct metal-to-metal bonding is formed. Although only a single die 300 is illustrated as being bonded to the die 200, other embodiments may include multiple dies 300 bonded to the die 200. In such embodiments, the multiple dies 300 may be in a stacked configuration (e.g., having multiple stacked dies 300) and/or a side-by-side configuration.

The dies 300 may have smaller surface area than the dies 200. The dies 200 extend laterally past the dies 300, and portions of the dielectric layer 106 are exposed after bonding the dies 200 and 300. By leaving a portion of the dielectric layer 106 exposed, an optional heat dissipation feature 112 may be attached to the dielectric layer 106 to surround the dies 300. The heat dissipation feature 112 may be a one or more silicon dies (see e.g., the top down view of FIG. 1F), a silicon ring (see e.g., the top down view of FIG. 1G), or the like that surrounds one or more sides of the dies 300. The heat dissipation feature 112 may be free of any active devices and/or free of any passive devices. Thus, the heat dissipation feature 112 may be referred to as a dummy feature in some embodiments.

The heat dissipation feature 112 may be bonded to the dielectric layer 106 with a dielectric-to-dielectric bond using, for example, a native oxide, thermal oxide, or the like formed at the bottom surface of the heat dissipation feature 112. The dielectric-to-dielectric bonding process may include applying a surface treatment to one or more of the dielectric layer 106 or the oxide on the heat dissipation feature 112. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the dielectric layer 106 or the oxide on the heat dissipation feature 112. The heat dissipation feature 112 may then be aligned to the dielectric layer 106, and the two are pressed against each other to initiate a pre-bonding of the heat dissipation feature 112 to the dies 200. The pre-bonding may be performed at room temperature (e.g., between about 21° C. and about 25° C.). After the pre-bonding, an annealing process may be applied by, for example, heating the heat dissipation feature 112 at a temperature between about 150° C. and about 400° C. for a duration between about 0.5 hours and about 3 hours. The annealing processes to bond the heat dissipation feature 112 to the die 200 and to bond the dies 300 to the die 200 may be performed concurrently so that separate anneals need not be performed.

Figure 2:
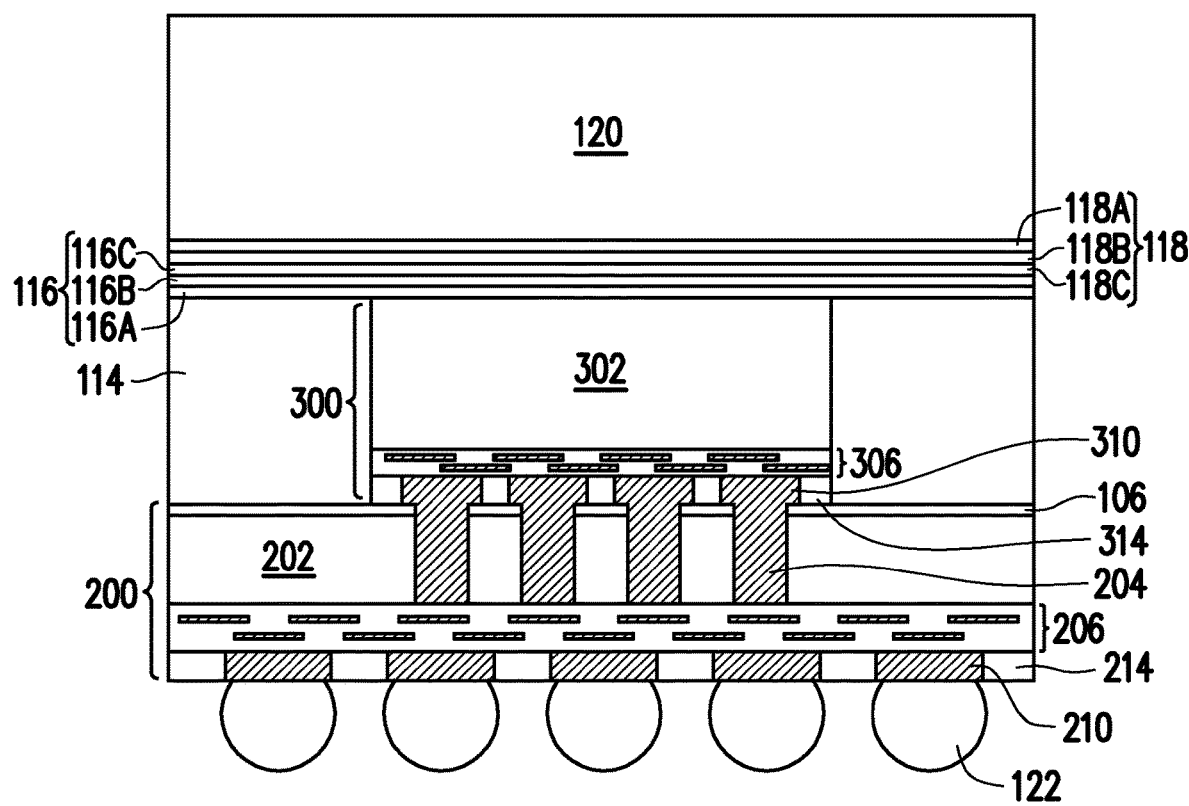
FIG. 2 illustrates a cross-sectional view of a semiconductor package in accordance with some embodiments.
Figure 3:
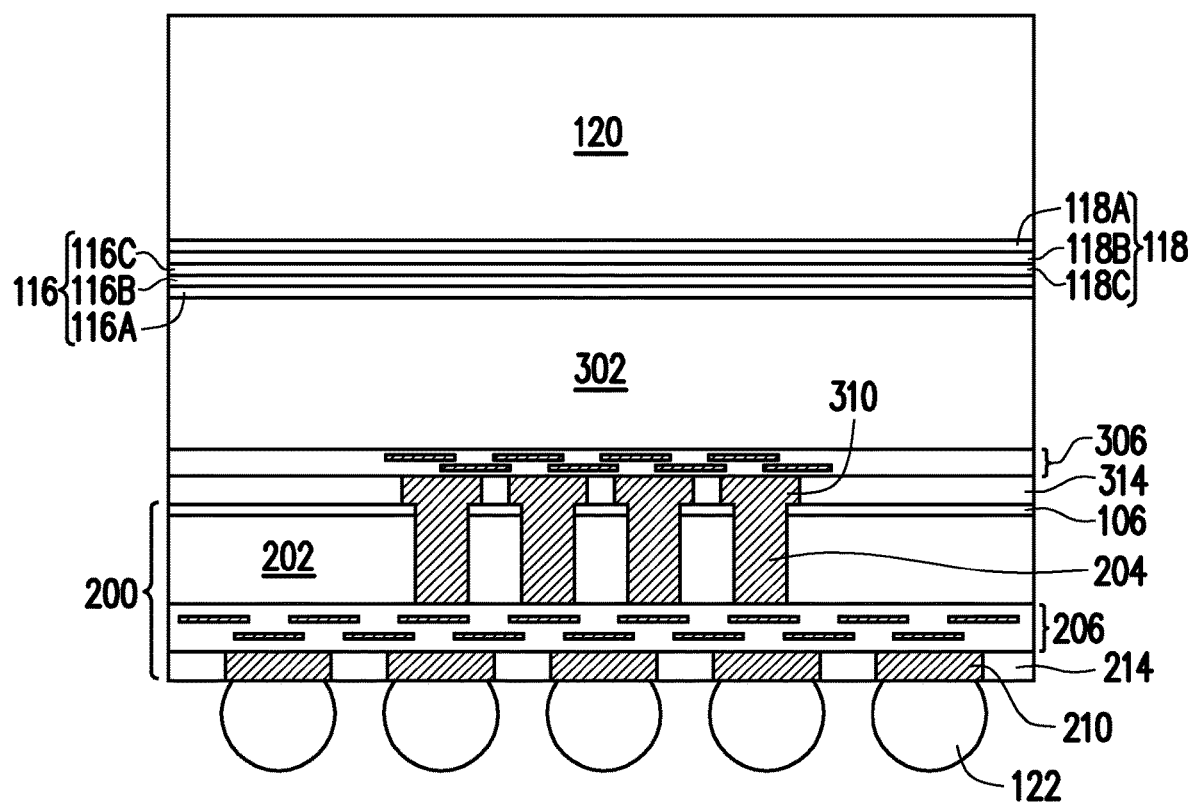
FIG. 3 illustrates a cross-sectional view of a semiconductor package in accordance with some embodiments.

In other embodiments, the heat dissipation feature 112 may be omitted (see e.g., FIGS. 2 and 3). In such embodiments, a surface area of the die 300 may be less than a surface area of the die 200 (see e.g., FIG. 2). Alternatively, a surface area of the die 300 may be the same as a surface area of the die 200, and the die 300 may be coterminous with the die 200 (see e.g., FIG. 3). For example, in some embodiments, the dies 300 may be bonded to the dies 200 while the dies 300 and the dies 200 are still integrated in their respective wafers using a wafer to wafer (WoW) bonding process. In other embodiments, singulated dies 300 may be bonded to the dies 200 while the die 200 is still integrated in a wafer using a chip to wafer (CoW) bonding process.

Figure 1H:
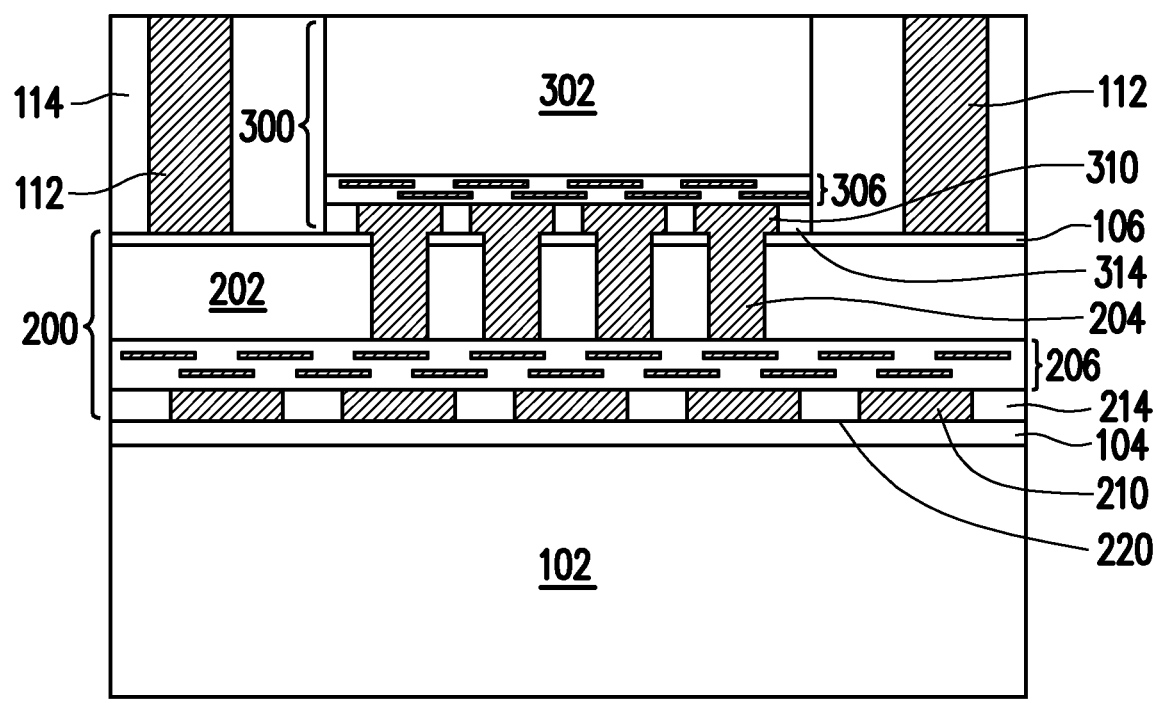

In FIG. 1H, an insulating material 114 is formed over the dies 200, around the dies 300, and around the heat dissipation feature 112 (if present). In some embodiments, the insulating material 114 is a molding compound (e.g., an epoxy, a resin, a moldable polymer, or the like) shaped or molded using for example, a mold (not shown) which may have a border or other feature for retaining insulating material 114 when applied. Such a mold may be used to pressure mold the insulating material 114 around the dies 300 to force the insulating material 114 into openings and recesses, eliminating air pockets or the like in the insulating material 114.

In some embodiments, the insulating material 114 is a dielectric comprising an oxide, nitride, oxynitride, or the like is formed over the dies 200. In such embodiments, insulating material 114 may comprise a silicon nitride, silicon oxide, silicon oxynitride, or another dielectric material, and is formed by chemical vapor deposition (CVD), plasma enhanced CVD (PECVD), or another process.

As also illustrated by FIG. 1H, the insulating material 114 may be planarized by, e.g., a grinding, chemical-mechanical polish (CMP) process, or the like. After planarization, top surfaces of the encapsulant 114, the dies 300, the heat dissipation features 112 (if present) are substantially level. The heat dissipation features 112 provide heat dissipation from surfaces of the dies 200 through the insulating material 114.

Figure 1I:
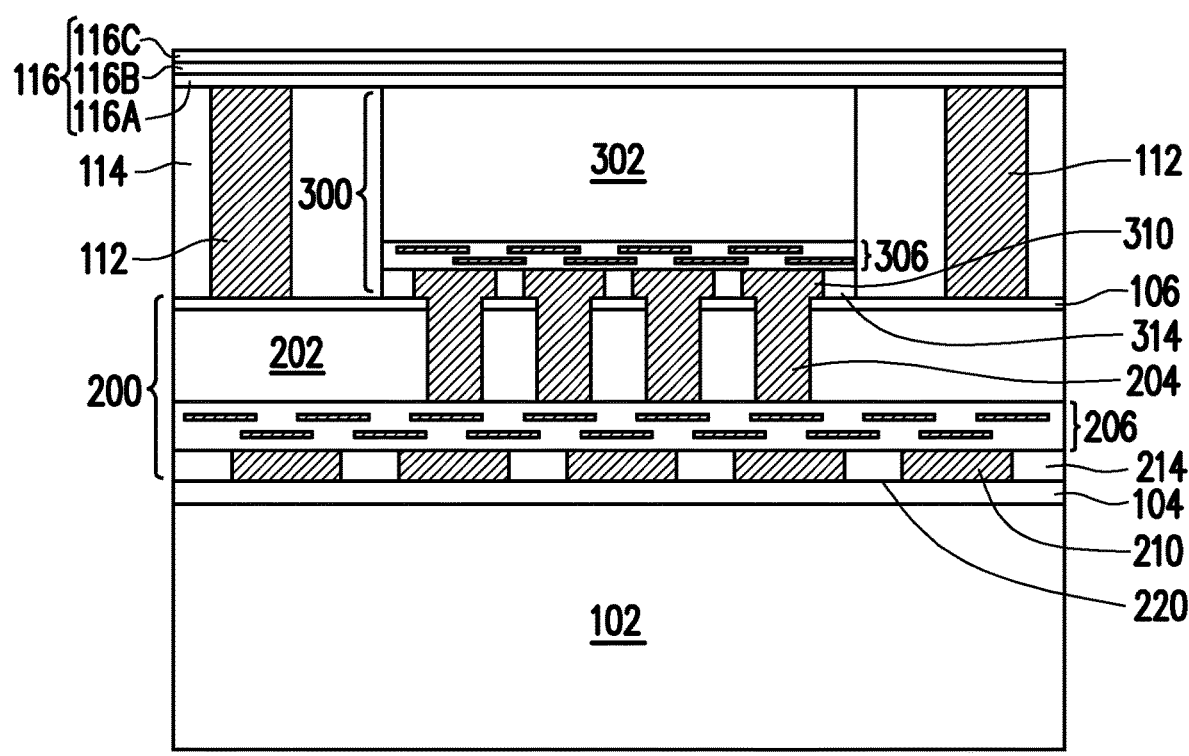

In FIG. 1I, a conductive bonding layer 116 is formed over the dies 300, the heat dissipation structure 112 (if present), and the insulating material 114. In some embodiments, the bonding layer 116 comprises one or more conductive layers (e.g., metal layers), such as an optional adhesion layer 116A, an optional diffusion barrier layer 116B, and a conductive layer 116C. Each of the layers in the bonding layer 116 may be deposited by PVD, CVD, ALD, plating, or the like. The adhesion layer 116A may comprise titanium, aluminum, tantalum, combinations of thereof or the like. The adhesion layer 116A helps adhere the layers 116B and 116C to the dies 300, the heat dissipation structure 112 (if present), and the insulating material 114, and the adhesion layer 116A may be omitted in some embodiments. The diffusion barrier layer 116B may comprise titanium, titanium nitride, tantalum, tantalum nitride, cobalt, combinations thereof, or the like. The diffusion barrier layer 116B may be used to prevent or at least reduce diffusion of the material of the conductive layer 116C into the underlying features of the package, and the diffusion barrier layer 116B may be omitted in some embodiments. The conductive layer 116C may comprise copper, aluminum, indium, combinations thereof, or the like. The conductive layer 116C may be used as a bonding interface for a substrate in a subsequent process step. The use of conductive layers as the bonding interface may have advantages, such as improved heat dissipation and adhesion in the resulting package structure.

Figure 1J:
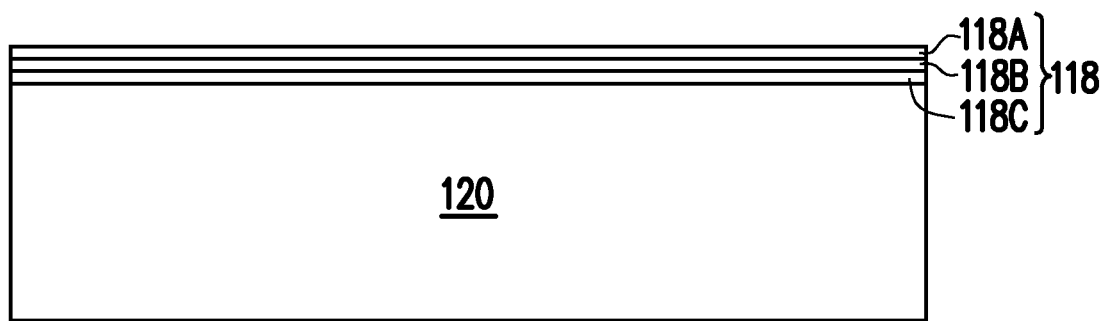

In FIG. 1J, a substrate 120 is provided. The substrate 120 may be selected to provide heat dissipation after it is attached to the dies 200 and 300 (see FIG. 1K). For example, the substrate 120 may be a silicon substrate, a glass substrate (e.g., a glass substrate having a thermal conductivity in a range of about 1.5 w/mK to about 5 w/mK, or the like. The substrate 120 may be free of any active devices and free of any passive devices in some embodiments.

As also illustrated in FIG. 1J, a conductive bonding layer 118 is formed over substrate 120. In some embodiments, the bonding layer 118 comprises one or more conductive layers (e.g., metal layers), such as an optional adhesion layer 118A, an optional diffusion barrier layer 118B, and a conductive layer 118C. Each of the layers in the bonding layer 118 may be deposited by PVD, CVD, ALD, plating, or the like. The adhesion layer 118A may comprise titanium, aluminum, tantalum, combinations of thereof or the like. The adhesion layer 118A helps adhere the layers 118B and 118C to the substrate 120, and the adhesion layer 118A may be omitted in some embodiments. The diffusion barrier layer 118B may comprise titanium, titanium nitride, tantalum, tantalum nitride, cobalt, combinations thereof, or the like. The diffusion barrier layer 118B may be used to prevent or at least reduce diffusion of the material of the conductive layer 118C into the underlying substrate 120, and the diffusion barrier layer 118B may be omitted in some embodiments. The conductive layer 118C may comprise cupper, aluminum, indium, combinations thereof, or the like. The conductive layer 118C may be used as a bonding interface for a substrate in a subsequent process step. The use of conductive layers as the bonding interface may have advantages, such as improved heat dissipation and adhesion in the resulting package structure.

A material of the conductive layer 118C may be the same or different from a material of the conductive layer 116C (see FIG. 1I). For example, in some embodiments, the conductive layers 116C and 118C may each be copper layers, gold layers, or the like. In some embodiments, the conductive layer 116C is a copper layer, and the conductive layer 118C is a gold layer; alternatively, the conductive layer 116C is a gold layer, and the conductive layer 118C is a copper layer. In some embodiments, the conductive layer 116C is an indium layer, and the conductive layer 118C is a gold layer; alternatively, the conductive layer 116C is a gold layer, and the conductive layer 118C is an indium layer.

Figure 1K:
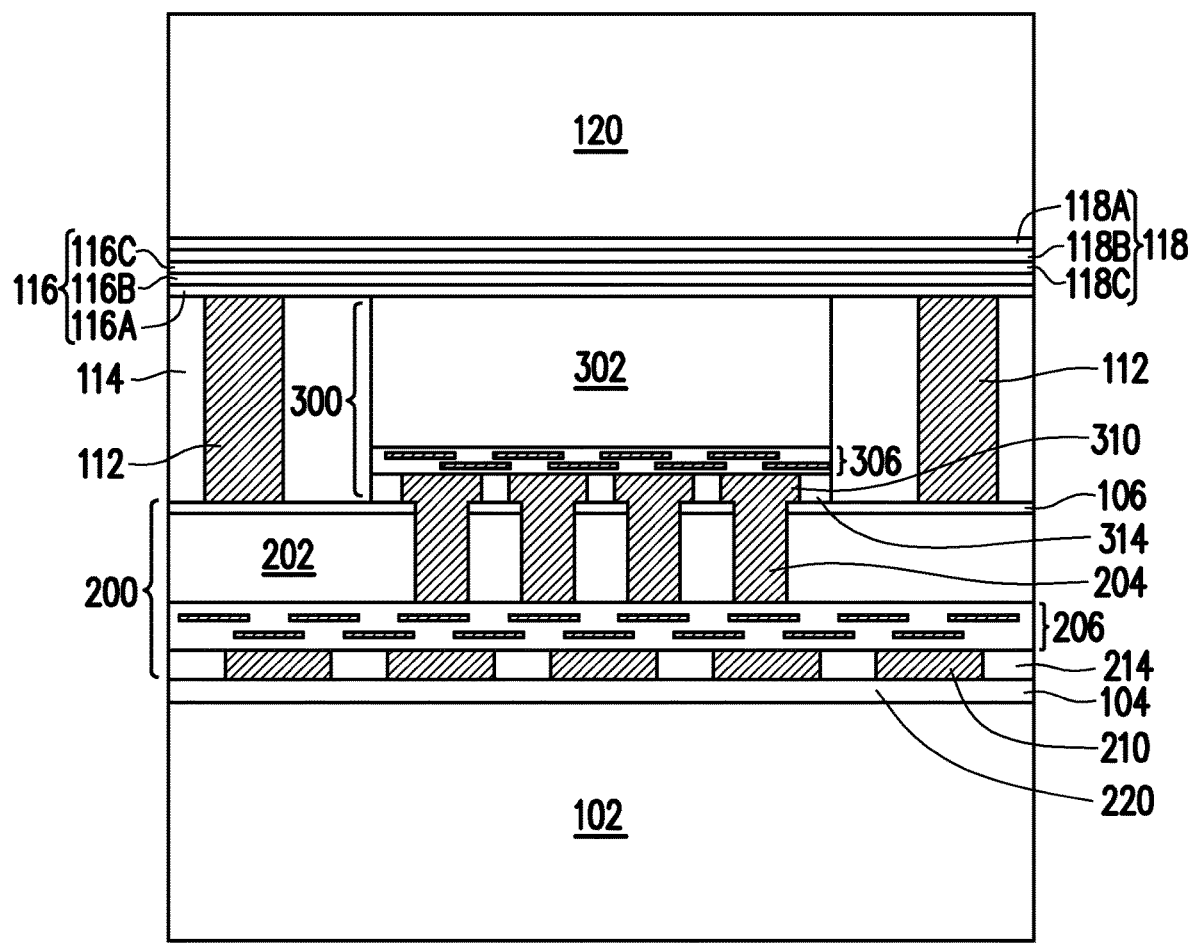

In FIG. 1K, the substrate 120 is bonded to the dies 200 and 300 by directly bonding the bonding layer 116 to the bonding layer 118. Directly bonding the bonding layers 116 and 118 may form metal-to-metal bonds (e.g., copper-copper bonds, copper-gold bonds, gold-gold bonds, indium-gold bonds, or the like) between the conductive layers 116C and 118C. Bonding the substrate 120 may include aligning the bonding layers 116 and 118, and the two are pressed against each other to initiate a pre-bonding of the substrate 120 to the dies 200 and 300. The pre-bonding may be performed at room temperature (e.g., between about 21° C. and about 25° C.). After the pre-bonding, an annealing process may be applied by, for example, heating at a temperature between about 150° C. and about 400° C. for a duration between about 0.5 hours and about 3 hours so that the metal (e.g., copper, gold, indium, and/or the like) in the bonding layers 116 and 118 inter-diffuses to each other, and hence the direct metal-to-metal bonding is formed.

The substrate 120 may provide improved thermal dissipation to the dies 200 and 300. For example, the dies 300, the heat dissipation features 112 (if present), and the bonding layers 116 and 118 may provide a thermal dissipation path from the die 200 to the substrate 120. Further, the substrate 120 may act as a carrier providing physical support to the dies 200 and 300. Thus, device reliability and durability may be improved.

Figure 1L:
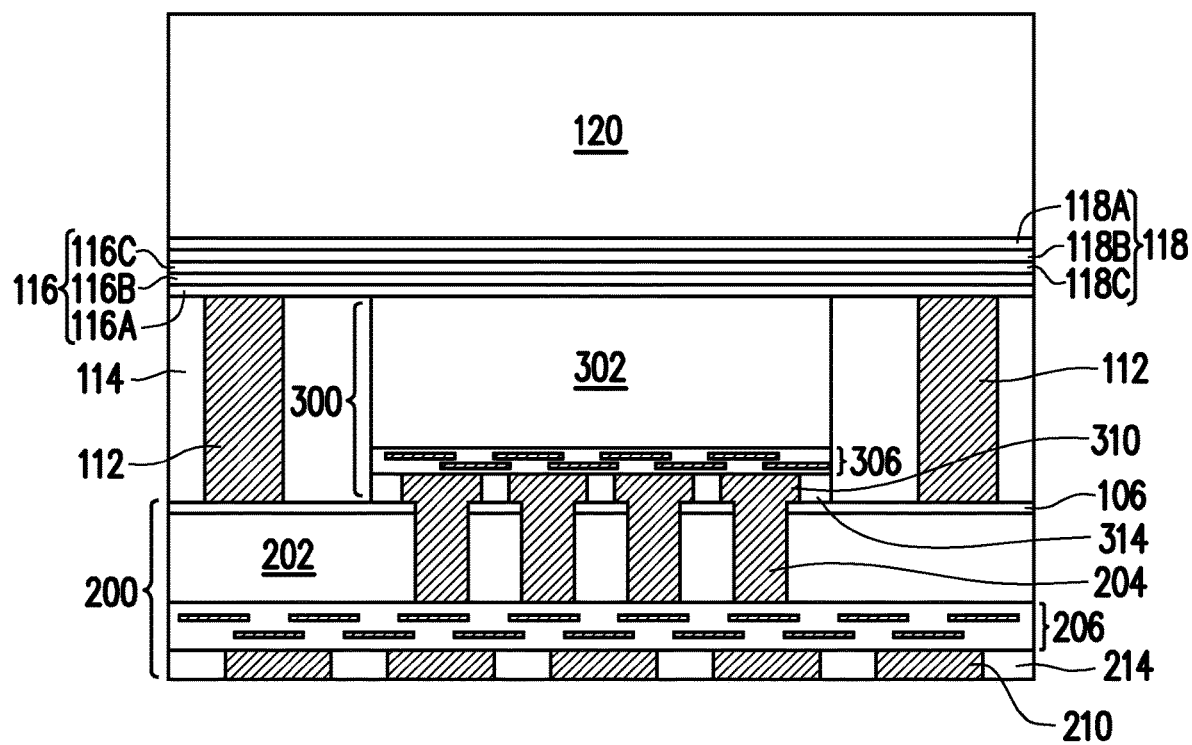

In FIG. 1L, a carrier substrate de-bonding is performed to detach (de-bond) the carrier substrate 102 from the dies 200. In accordance with some embodiments, the de-bonding includes projecting a light such as a laser light or an UV light on the release layer 104 that the release layer 104 decomposes under the heat of the light and the carrier substrate 102 can be removed. After the carrier substrate 102 is removed, openings are formed through the passivation layer 214 to expose portions of the contact pads 210. The openings may be formed, for example, using laser drilling, etching, or the like.

Figure 1M:
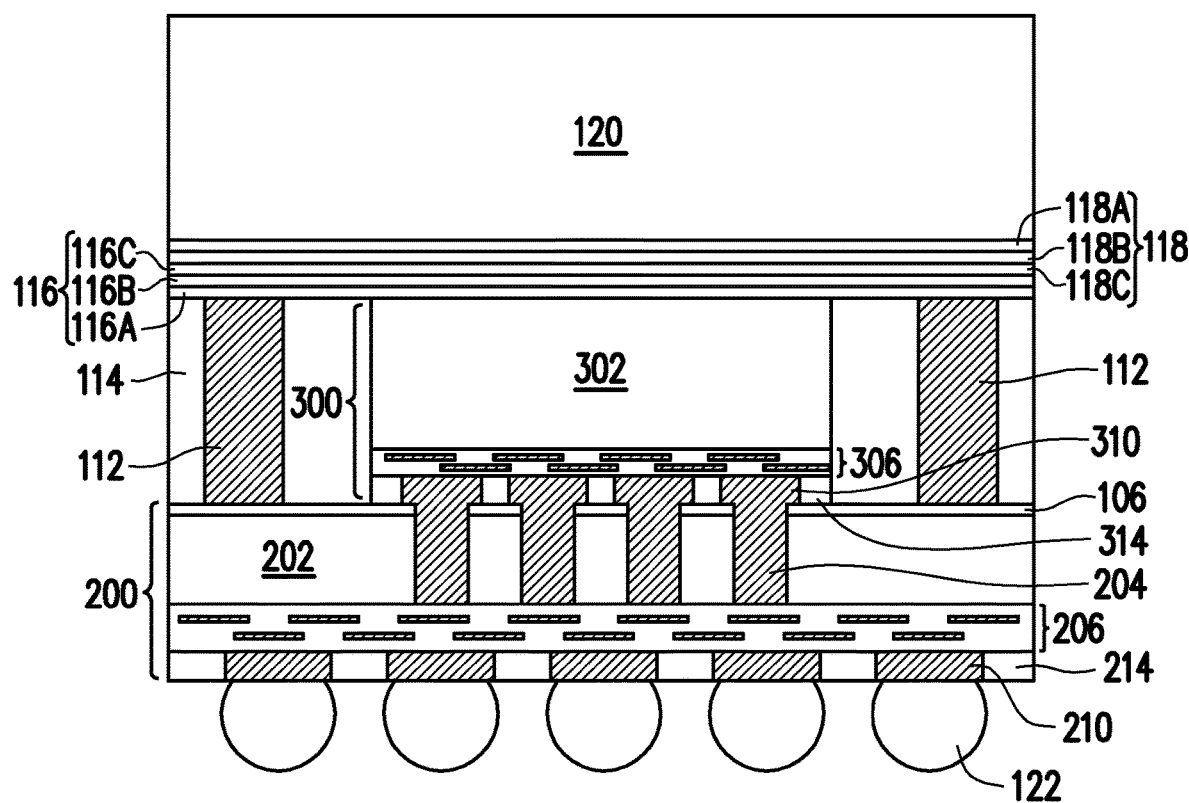

Next in FIG. 1M, conductive connectors 122 are formed on the contact pads 210. The conductive connectors 122 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 122 may include a conductive material such as solder, copper, aluminum, gold, nickel, silver, palladium, tin, the like, or a combination thereof. In some embodiments, the conductive connectors 122 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 122 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 122. The metal cap layer may include nickel, tin, tin-lead, gold, silver, palladium, indium, nickel-palladium-gold, nickel-gold, the like, or a combination thereof and may be formed by a plating process.

Thus, a semiconductor package 400 is formed. The package substrate 400 comprises a first die 200 and a second die 300 hybrid bonded to the first die. For example, the first die 200 may be bonded to the second die 300 through a combination of dielectric-to-dielectric bonds and metal-to-metal bonds. In some embodiments, the first die 200 is bonded to the second die 300 without any intervening solder regions. An insulating material 114 is disposed around the second die 300, and one or more heat dissipation features 112 extend from a surface of the first die 200 through the insulating material 114. A substrate 120 is bonded to an opposing side of the second die 300 as the first die 200 using for example, direct metal-to-metal bonding. For example, a conductive bonding layer 116 over the second die 300 and the insulating material 114 may be directly bonded to a conductive bonding layer 118 that was formed on a silicon substrate. The substrate 120 provides heat dissipation and support in the semiconductor package 400.

In embodiments where the dies 200 are packaged while part of a wafer, a singulation may be applied to separate the semiconductor package 400 from other concurrently formed semiconductor packages. As a result of the singulation, the substrate 120, the conductive bonding layer 116, the conductive bonding layer 118, the insulating material 114, and the die 200 may all be coterminous.

FIG. 2 illustrates a cross-sectional view of a semiconductor package 410 according to some alternate embodiments. Semiconductor package 410 may be similar to semiconductor package 400 where like reference numerals indicate like elements formed using like processes. In semiconductor package 410, the heat dissipation features 112 are omitted. The die 200 may be wider than and extend laterally past the die 300.

FIG. 3 illustrates a cross-sectional view of a semiconductor package 420 according to some alternate embodiments. Semiconductor package 420 may be similar to semiconductor package 400 where like reference numerals indicate like elements formed using like processes. In semiconductor package 420, the heat dissipation features 112 are omitted. The die 200 may have a same width as and be coterminous with the die 300.

Figure 4A:
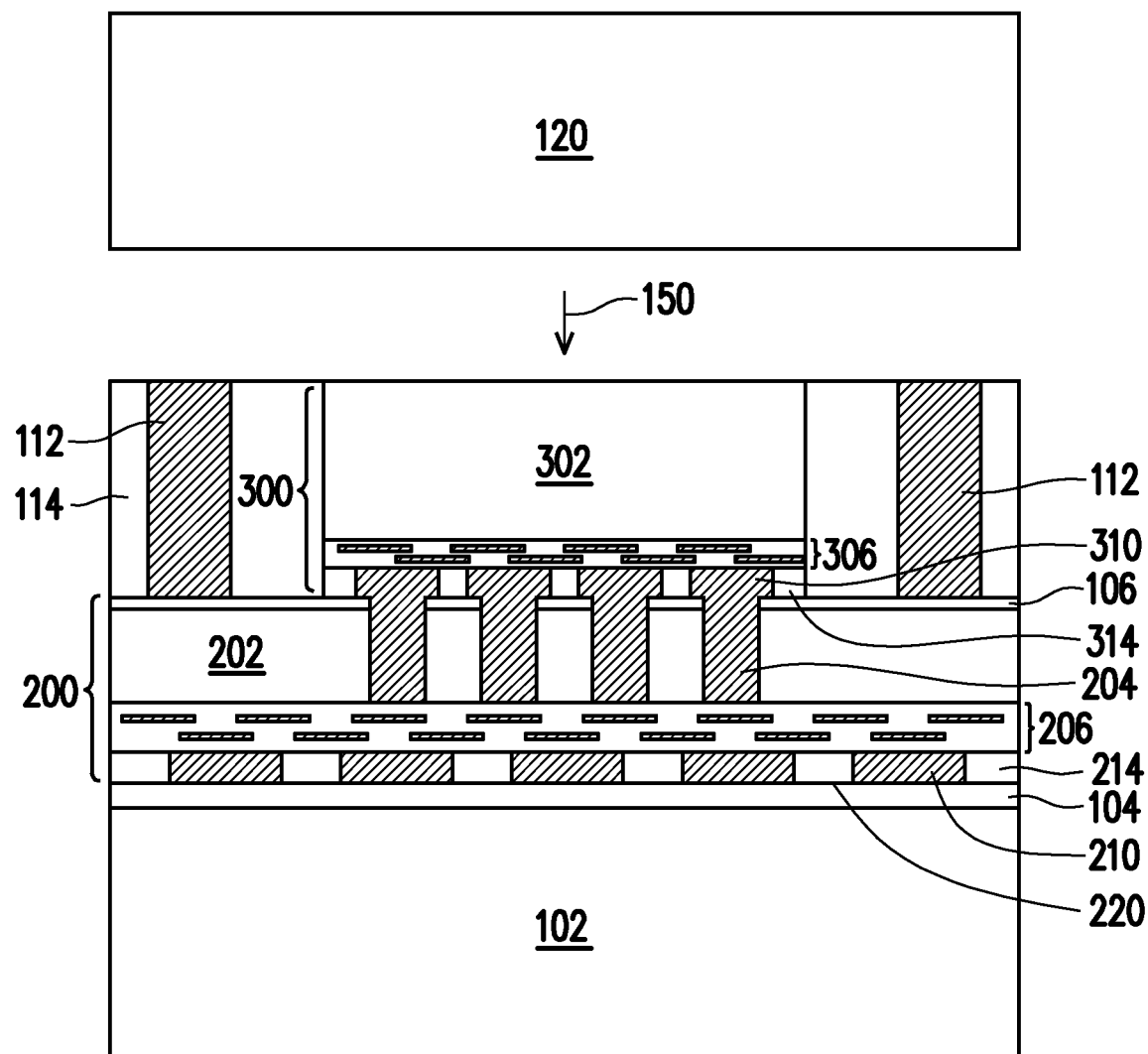
FIGS. 4A through 4C illustrate cross-sectional views of intermediate steps of manufacturing a semiconductor package in accordance with some embodiments.
Figure 4B:
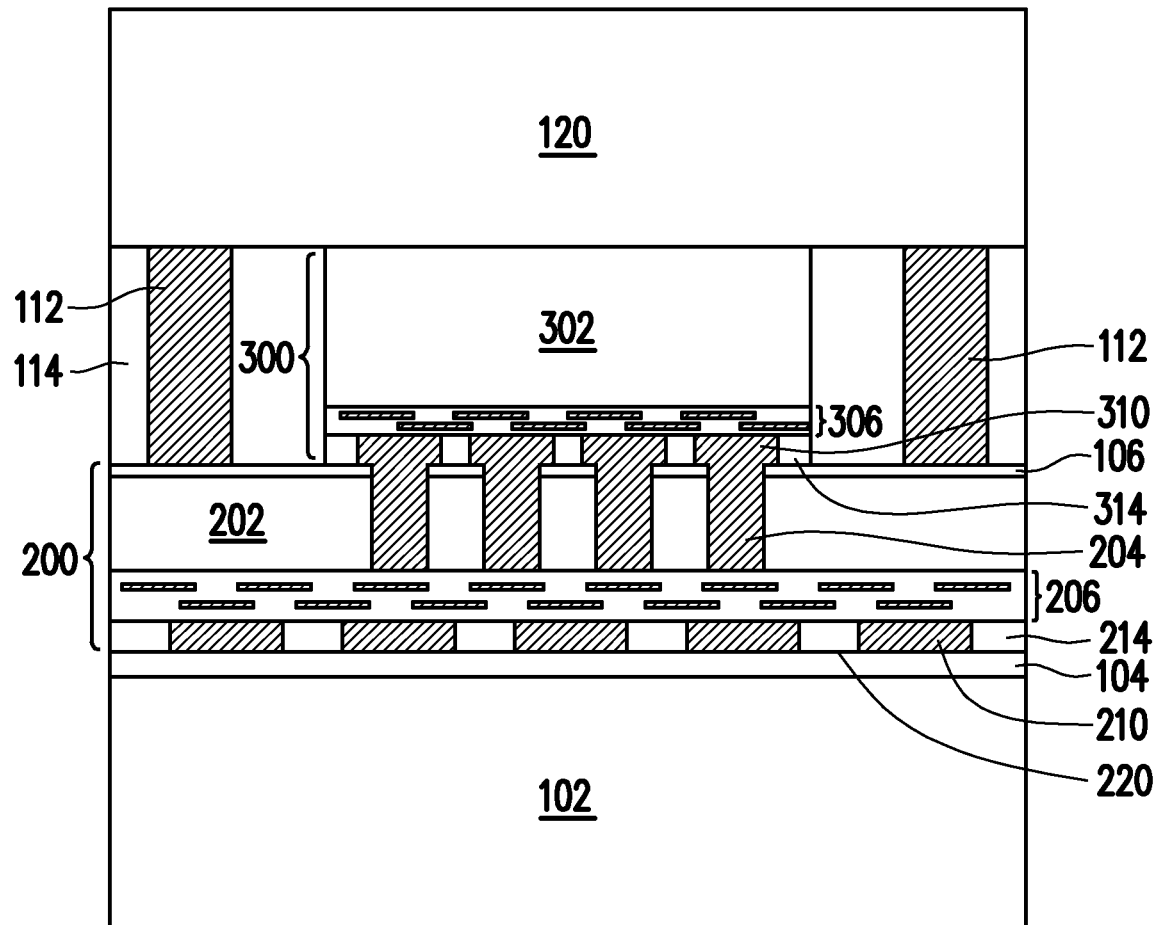
Figure 4C:
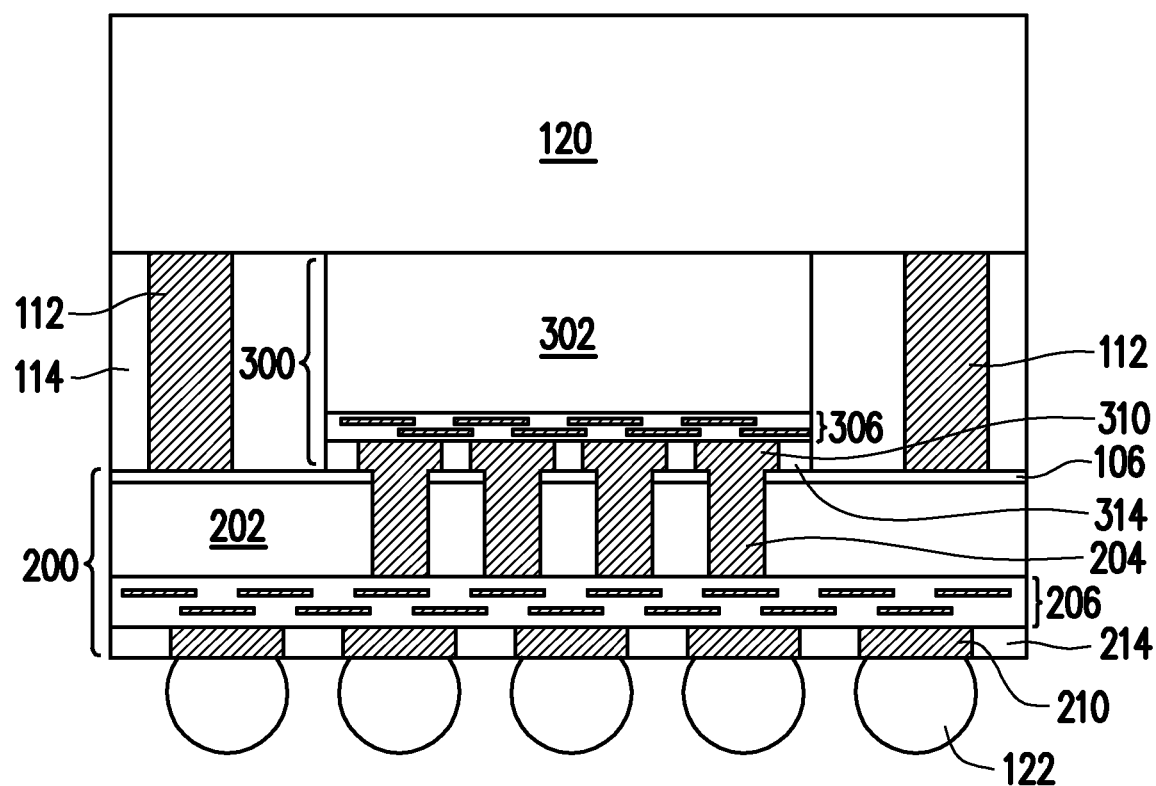

FIGS. 4A through 4C illustrate cross-sectional views of intermediary stages of forming a semiconductor package 500 according to some embodiments. In FIG. 4A, a similar structure as that described above with respect to FIGS. 1I and 1J is illustrated where like reference numerals indicate like elements formed using like processes. However, in FIG. 4A, the bonding layer 116 is omitted from over the dies 200 and the dies 300. Further, the bonding layer 118 is omitted from the substrate 120. In FIG. 4A, the substrate 120 is aligned to the die 300, the insulating material 114, and the heat dissipation features 112 such that an exposed surface of the substrate 120 faces exposed surfaces of the dies 300, the insulating material 114, and the heat dissipation features 112. This is indicated by arrow 150.

In FIG. 4B, the substrate 120 is directly bonded to the dies 300, the insulating material 114, and the heat dissipation features 112 using direct bonding without depositing any intervening bonding layers, for example. In some embodiments, the direct bonds are formed between the substrate 120 and the dies 300, and direct bonds may also be formed between the heat dissipation features 112 and the substrate 120.

As an example of directly bonding the substrate 120, a surface treatment may be performed on the substrate 120. The surface treatment includes forming a native oxide or a thermal oxide on a surface of the substrate 120. The surface treatment may further include a plasma treatment process, and the process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surface of the substrate 120 increases, for example, by interacting with the native or thermal oxide present at a surface of the substrate 120. Next, the substrate 120 is pressed against the dies 300, the insulating material 114, and the heat dissipation features 112 to form weak bonds. Subsequently, an annealing is performed to strengthen the weak bonds and form a fusion bond. During the annealing, the H of the OH bonds is outgassed, thereby forming Si—O—Si bonds between the substrate 120 and the dies 300, thereby strengthening the bonds.

The substrate 120 may provide improved thermal dissipation to the dies 200 and 300. For example, the dies 300 and the heat dissipation features 112 (if present) may provide a thermal dissipation path from the die 200 to the substrate 120. Further, the substrate 120 may act as a carrier providing physical support to the dies 200 and 300. Thus, device reliability and durability may be improved. FIG. 4C illustrates the resulting package after processing (e.g., as described above in FIGS. 1L through 1M) is performed to remove the carrier 102 and form the connectors 122.

Figure 5:
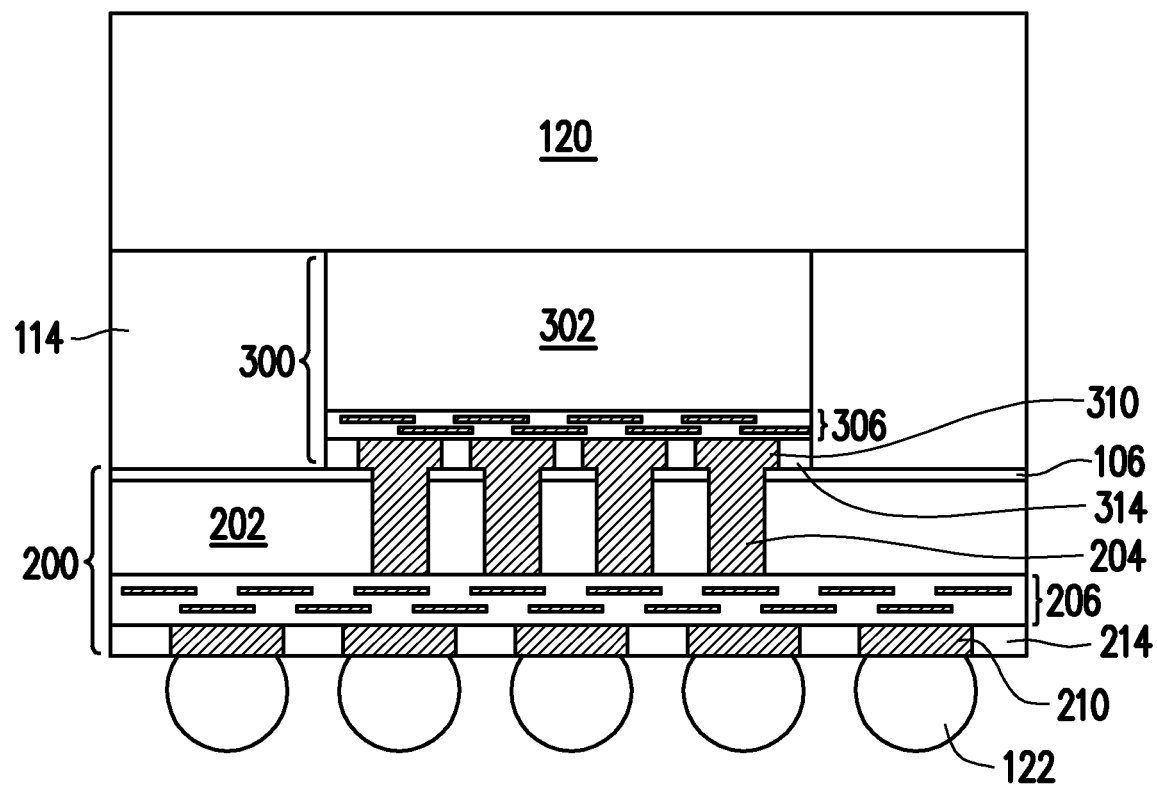
FIG. 5 illustrates a cross-sectional view of a semiconductor package in accordance with some embodiments.

FIG. 5 illustrates a cross-sectional view of a semiconductor package 510 according to some alternate embodiments. Semiconductor package 510 may be similar to the semiconductor package 500 where like reference numerals indicate like elements formed using like processes. For example, in the semiconductor package 510, the substrate 120 is directly bonded to the die 300 without any intervening bonding layers. In semiconductor package 510, the heat dissipation features 112 are omitted, and the die 200 may be wider than and extend laterally past the die 300.

Figure 6:
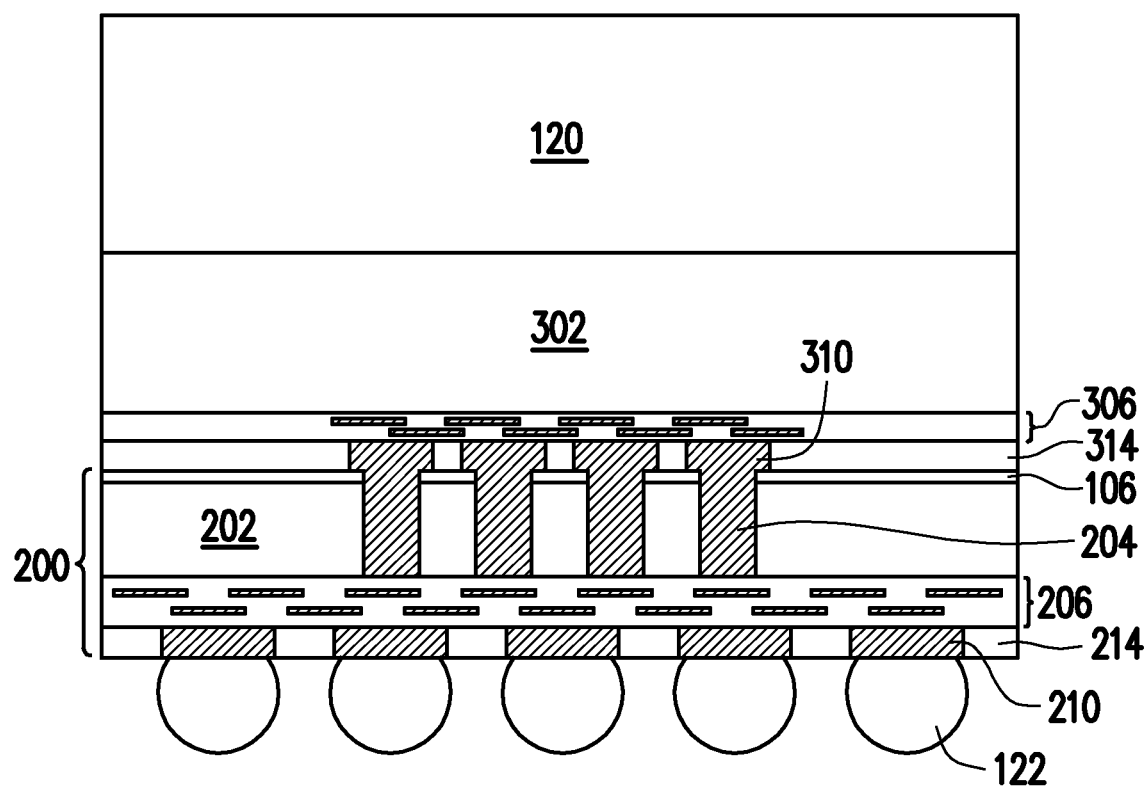
FIG. 6 illustrates a cross-sectional view of a semiconductor package in accordance with some embodiments.

FIG. 6 illustrates a cross-sectional view of a semiconductor package 520 according to some alternate embodiments. Semiconductor package 520 may be similar to semiconductor package 500 where like reference numerals indicate like elements formed using like processes. For example, in the semiconductor package 520, the substrate 120 is directly bonded to the die 300 without any intervening bonding layers. In semiconductor package 520, the heat dissipation features 112 are omitted, and the die 200 may have a same width as and be coterminous with the die 300.

Figure 7A:
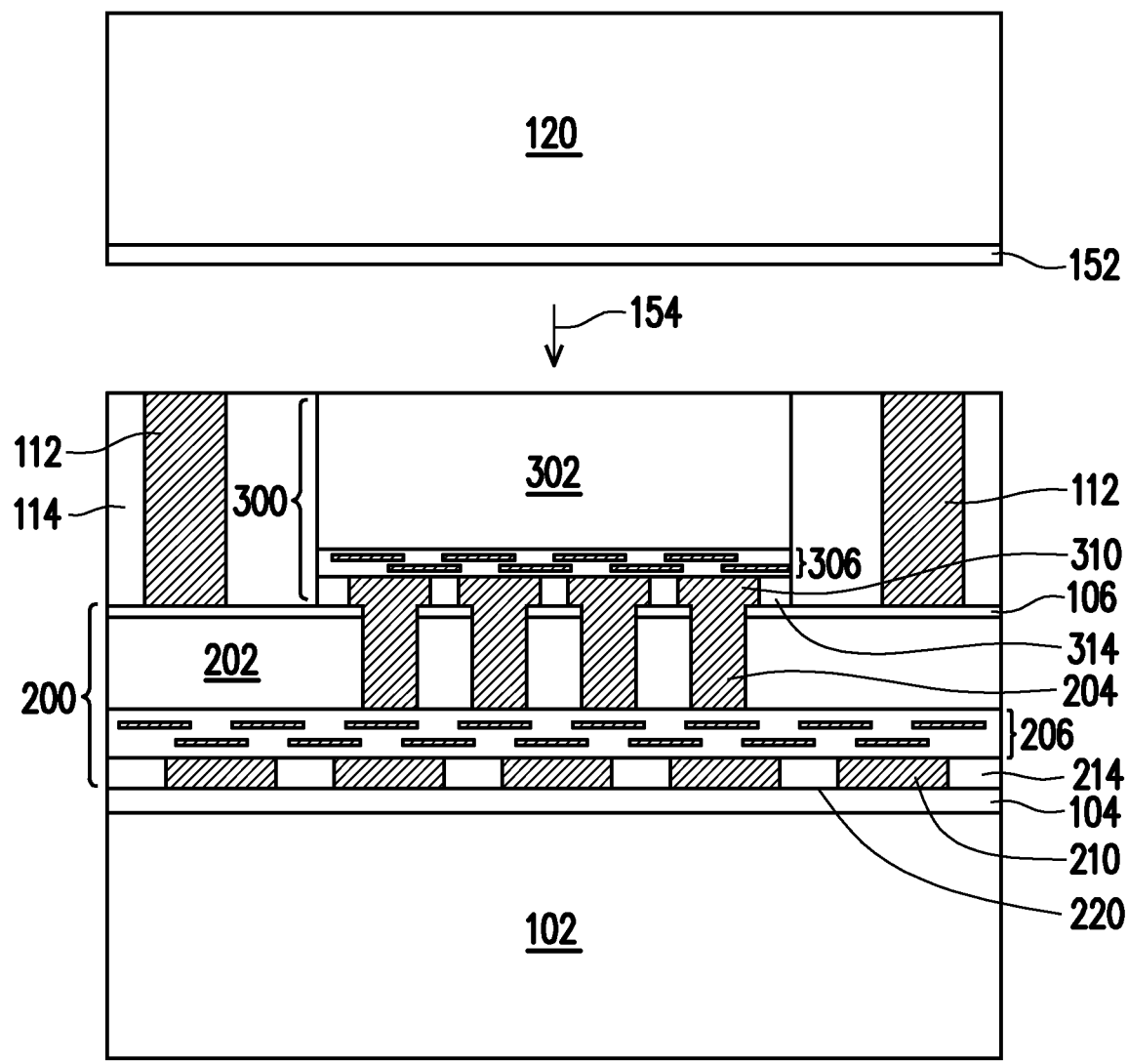
FIGS. 7A through 7D illustrate cross-sectional views of intermediate steps of manufacturing a semiconductor package in accordance with some embodiments.

FIGS. 7A through 7D illustrate cross-sectional views of intermediary stages of forming a semiconductor package 600 according to some embodiments. In FIG. 7A, a similar structure as that described above with respect to FIGS. 1I and 1J is illustrated where like reference numerals indicate like elements formed using like processes. However, in FIG. 7A, the bonding layer 116 is omitted from over the dies 200 and the dies 300. Further, the bonding layer 118 is omitted from the substrate 120. In FIG. 7A, a dielectric bonding layer 152 is deposited on the carrier substrate 120. The dielectric bonding layer 152 may comprise silicon oxide, silicon oxynitride, or the like and be deposited by CVD, PVD, ALD, or the like. Alternatively, the dielectric bonding layer 152 may be deposited on the dies 300, the heat dissipation feature 112, and the insulating material 114 instead of the substrate 120 (see FIG. 7B).

Figure 7B:
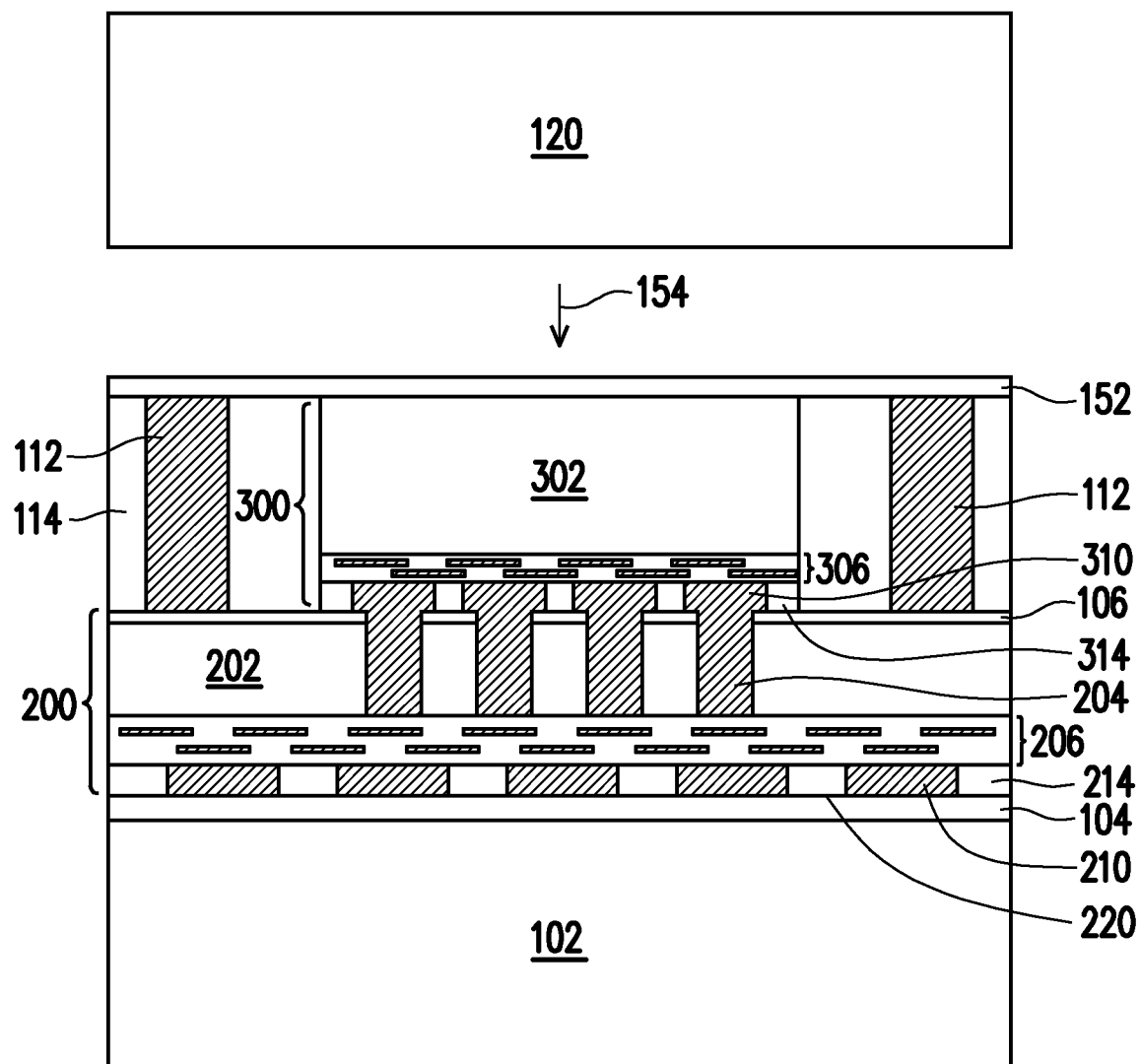

In FIGS. 7A and 7B, the substrate 120 is aligned to the die 300, the insulating material 114, and the heat dissipation features 112 such that an exposed surface of the substrate 120 faces exposed surfaces of the dies 300, the insulating material 114, and the heat dissipation features 112. This is indicated by arrow 154.

Figure 7C:
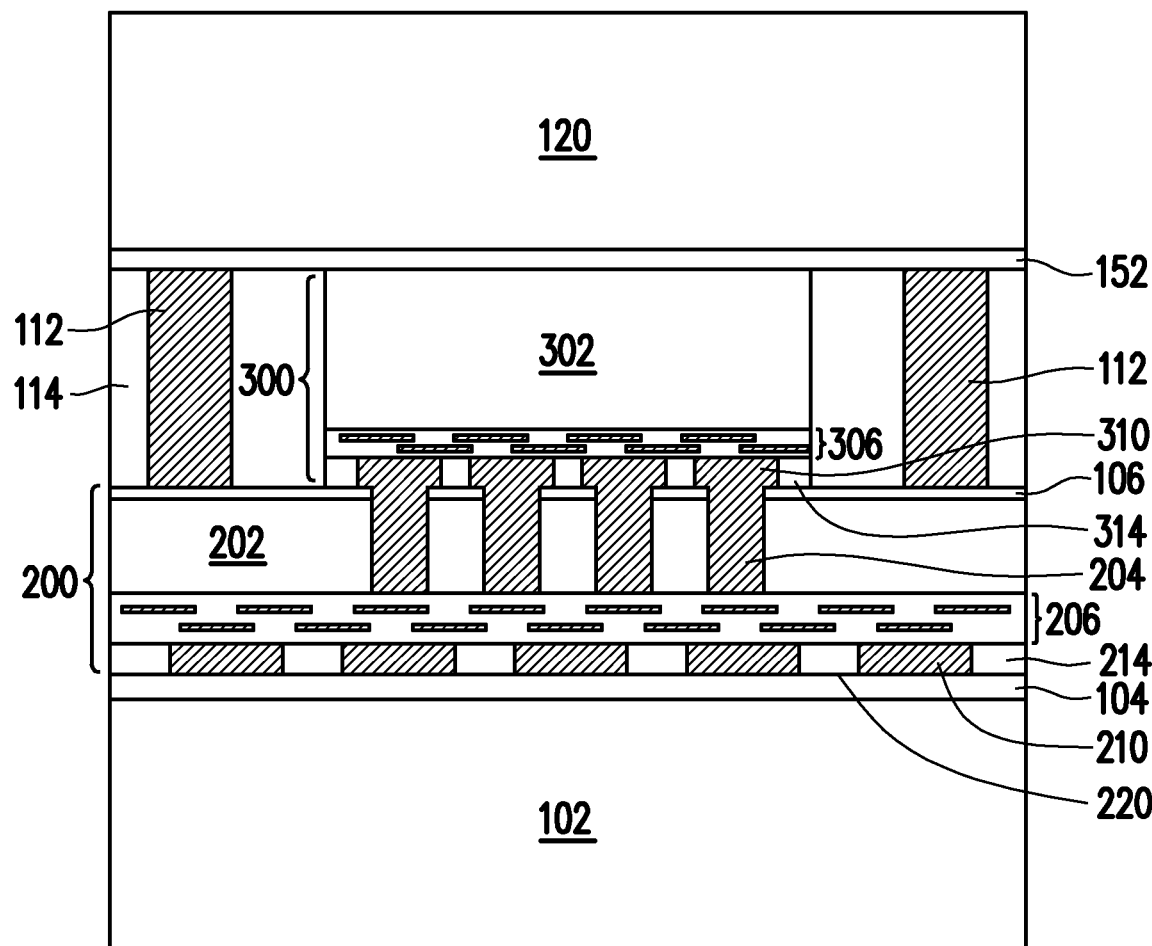

In FIG. 7C, the substrate 120 is bonded to the dies 300, the insulating material 114, and the heat dissipation features 112 using the dielectric bonding layer 152 to form dielectric-to-semiconductor bonds, for example. In some embodiments, the dielectric-to-semiconductor bonds are formed between the dielectric bonding layer 152 and the dies 300 and between the heat dissipation features 112 and the substrate 120. In some embodiments, the dielectric-to-semiconductor bonds are formed between the dielectric bonding layer 152 and the substrate 120.

Figure 7D:
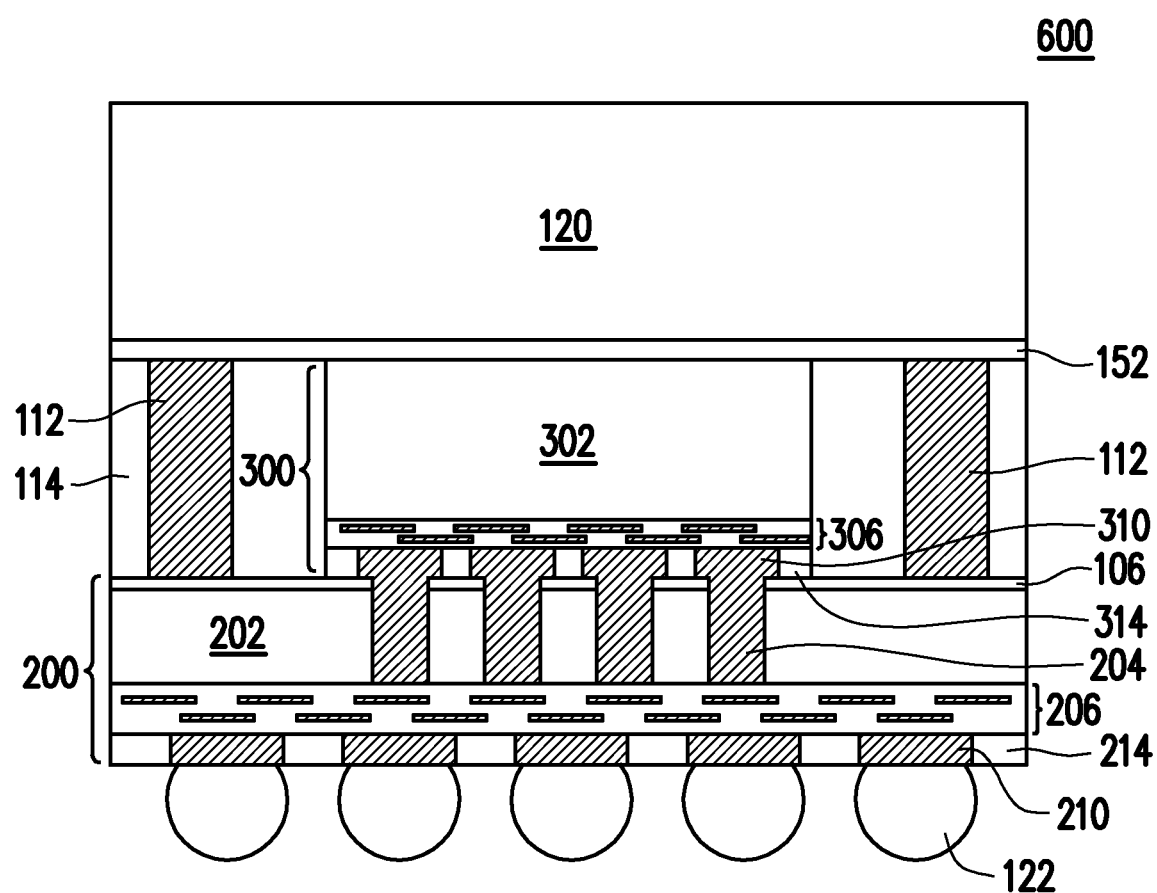

The substrate 120 may provide improved thermal dissipation to the dies 200 and 300. For example, the dies 300 and the heat dissipation features 112 (if present) may provide a thermal dissipation path from the die 200 to the substrate 120. Further, the substrate 120 may act as a carrier providing physical support to the dies 200 and 300. Thus, device reliability and durability may be improved. FIG. 7D illustrates the resulting package after processing (e.g., as described above in FIGS. 1L through 1M) is performed to remove the carrier 102 and form the connectors 122. Thus, a semiconductor package 600 is formed.

Figure 8:
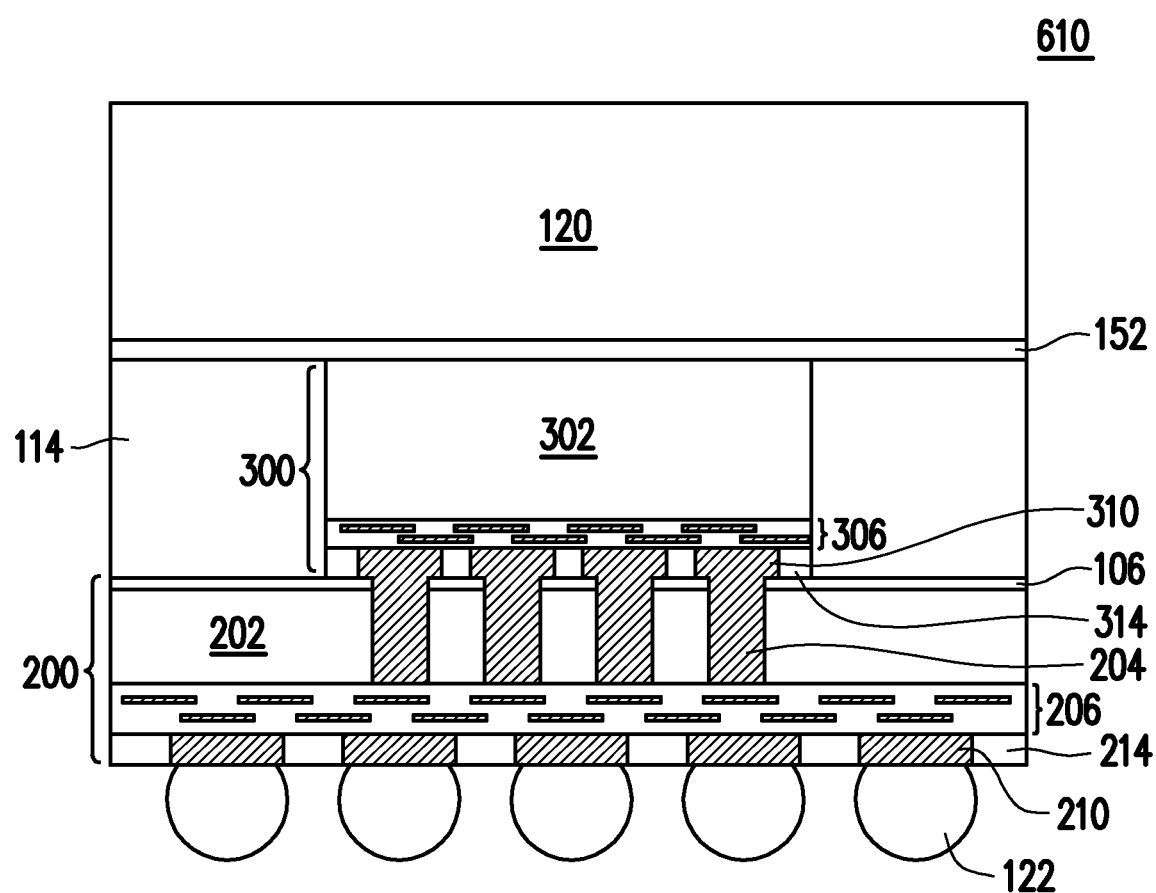
FIG. 8 illustrates a cross-sectional view of a semiconductor package in accordance with some embodiments.

FIG. 8 illustrates a cross-sectional view of a semiconductor package 610 according to some alternate embodiments. The semiconductor package 610 may be similar to the semiconductor package 600 where like reference numerals indicate like elements formed using like processes. For example, in the semiconductor package 610, the substrate 120 is bonded to the die 300 with the dielectric bonding layer 152. In semiconductor package 610, the heat dissipation features 112 are omitted, and the die 200 may be wider than and extend laterally past the die 300.

Figure 9:
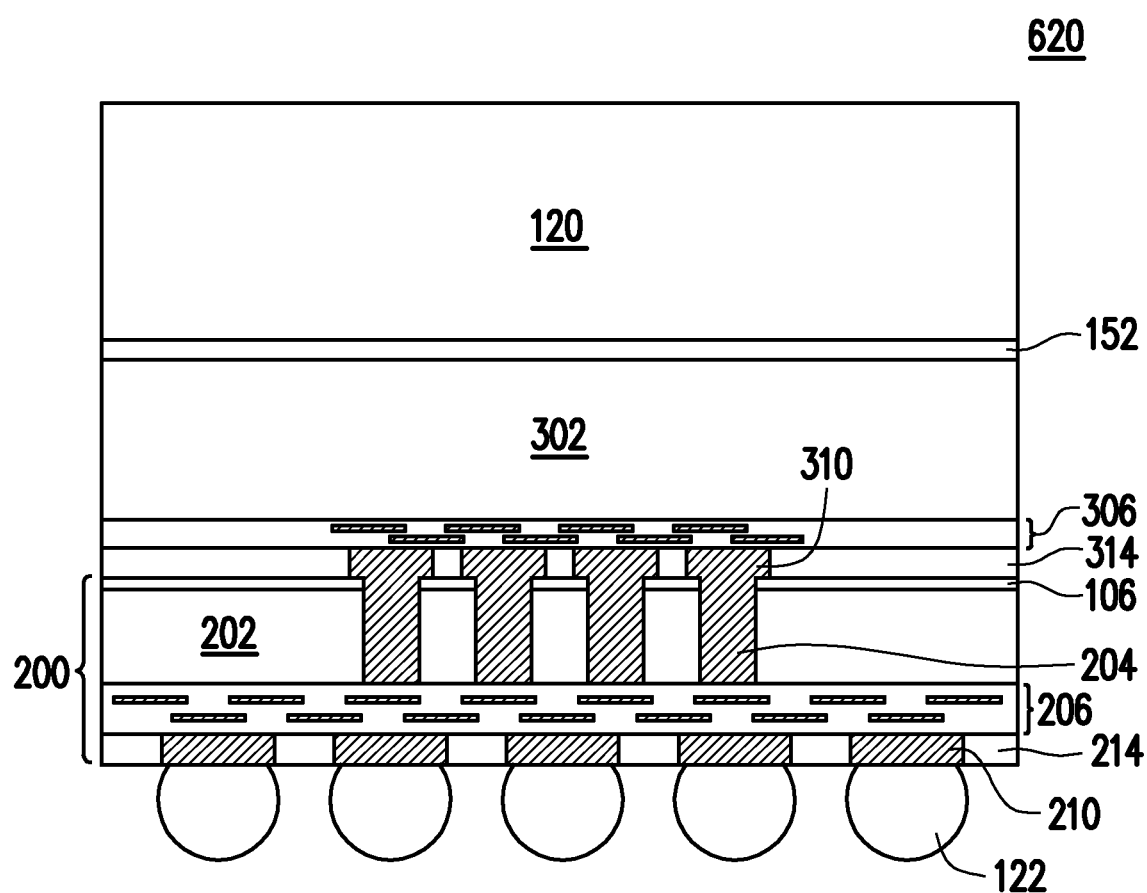
FIG. 9 illustrates a cross-sectional view of a semiconductor package in accordance with some embodiments.

FIG. 9 illustrates a cross-sectional view of a semiconductor package 620 according to some alternate embodiments. The semiconductor package 620 may be similar to the semiconductor package 600 where like reference numerals indicate like elements formed using like processes. For example, in the semiconductor package 620, the substrate 120 is bonded to the die 300 with the dielectric bonding layer 152. In semiconductor package 620, the heat dissipation features 112 are omitted, and the die 200 has a same width as and is coterminous with the die 300.

Figure 10A:
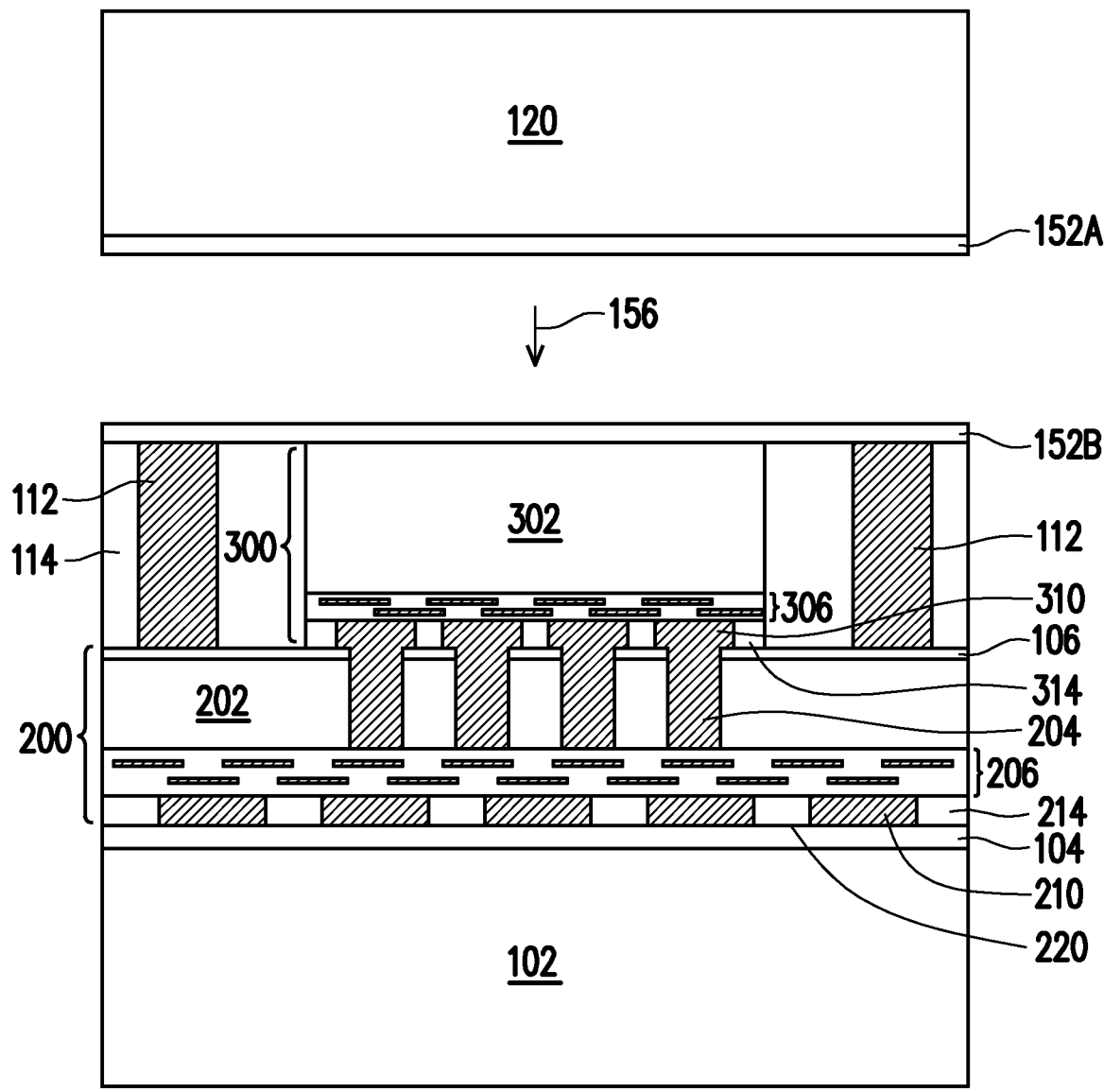
FIGS. 10A through 10C illustrate cross-sectional views of intermediate steps of manufacturing a semiconductor package in accordance with some embodiments.
Figure 10B:
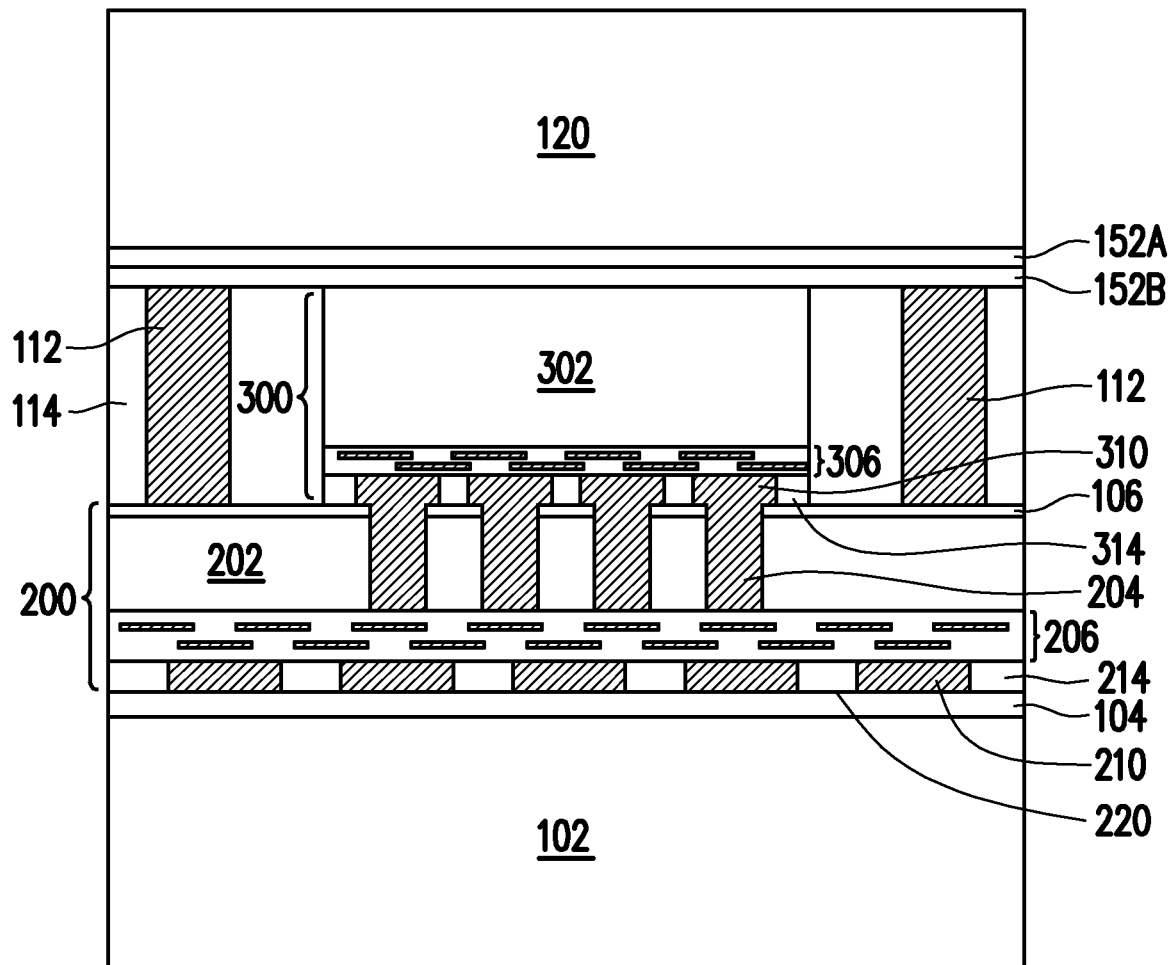
Figure 10C:
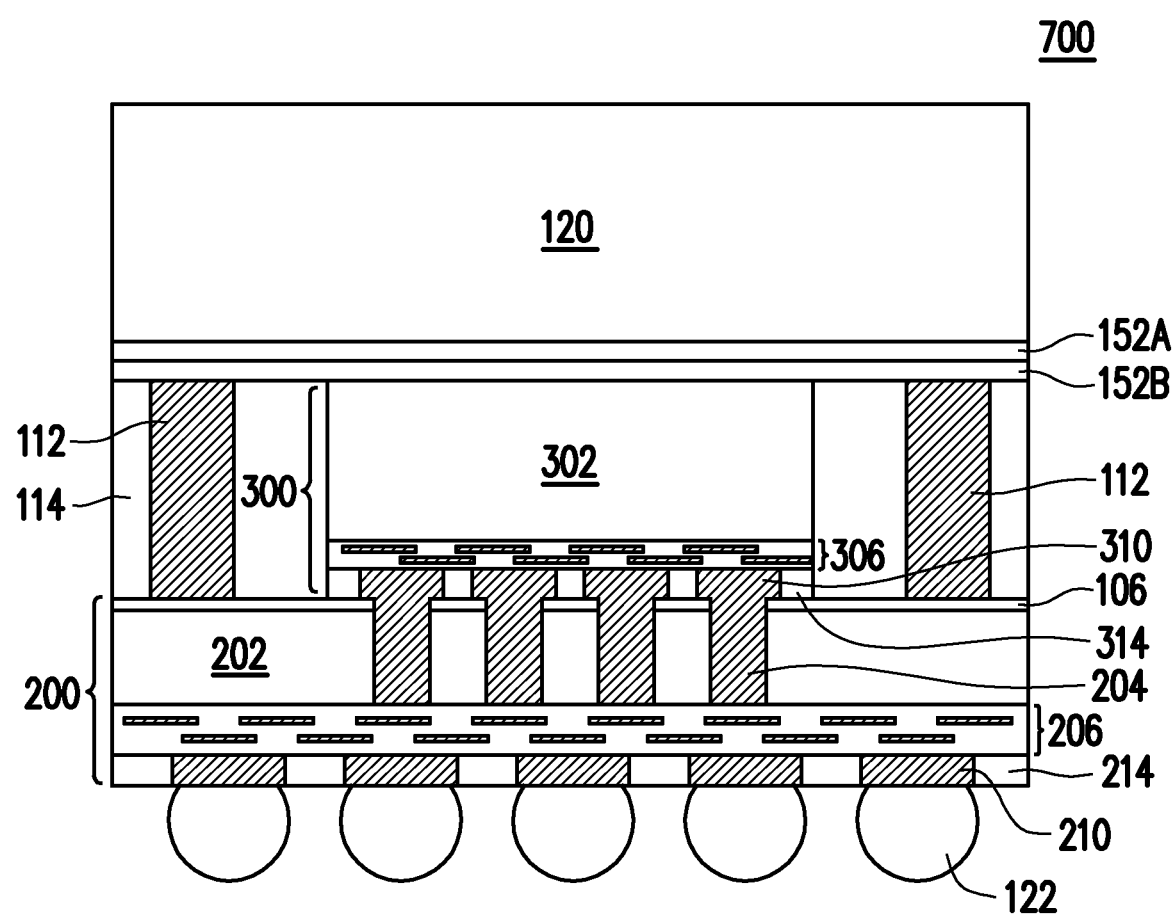

FIGS. 10A through 10C illustrate cross-sectional views of intermediary stages of forming a semiconductor package 700 according to some embodiments. In FIG. 10A, a similar structure as that described above with respect to FIGS. 1I and 1J is illustrated where like reference numerals indicate like elements formed using like processes. However, in FIG. 10A, the bonding layer 116 is omitted from over the dies 200 and the dies 300. Further, the bonding layer 118 is omitted from the substrate 120. A first dielectric bonding layer 152A is formed on the substrate 120, and a second dielectric bonding layer 152B is formed on the dies 300, the insulating material 114, and the heat dissipation features 112. The dielectric bonding layers 152A and 152B are substantially similar to the dielectric bonding layer 152 and may be formed a similar material using a similar process as described above.

The substrate 120 is aligned to the die 300, the insulating material 114, and the heat dissipation features 112 such that an exposed surface of the substrate 120 faces exposed surfaces of the dies 300, the insulating material 114, and the heat dissipation features 112. This is indicated by arrow 156.

In FIG. 10B the substrate 120 is bonded to the dies 300, the insulating material 114, and the heat dissipation features 112 using the dielectric bonding layers 152A and 152B to form dielectric-to-dielectric bonds, for example. In some embodiments, the dielectric-to-dielectric bonds are formed between the dielectric bonding layer 152A and the dielectric bonding layer 152B.

As an example of forming the dielectric-to-dielectric bonds, a surface treatment may be performed on the dielectric bonding layer 152A and/or the dielectric bonding layer 152B. The surface treatment may further includes a plasma treatment process, and the process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surface of the dielectric bonding layers 152A and/or 152B. Next, the dielectric bonding layer 152A is pressed against the dielectric bonding layer 152B to form weak bonds. Subsequently, an annealing is performed to strengthen the weak bonds and form a fusion bond. During the annealing, the H of the OH bonds is outgassed, thereby forming Si—O—Si bonds between the dielectric bonding layers 152A and 152B, thereby strengthening the bonds.

The substrate 120 may provide improved thermal dissipation to the dies 200 and 300. For example, the dies 300 and the heat dissipation features 112 (if present) may provide a thermal dissipation path from the die 200 to the substrate 120. Further, the substrate 120 may act as a carrier providing physical support to the dies 200 and 300. Thus, device reliability and durability may be improved. FIG. 10C illustrates the resulting package after processing (e.g., as described above in FIGS. 1L through 1M) is performed to remove the carrier 102 and form the connectors 122. Thus, a semiconductor package 700 is formed.

Figure 11:
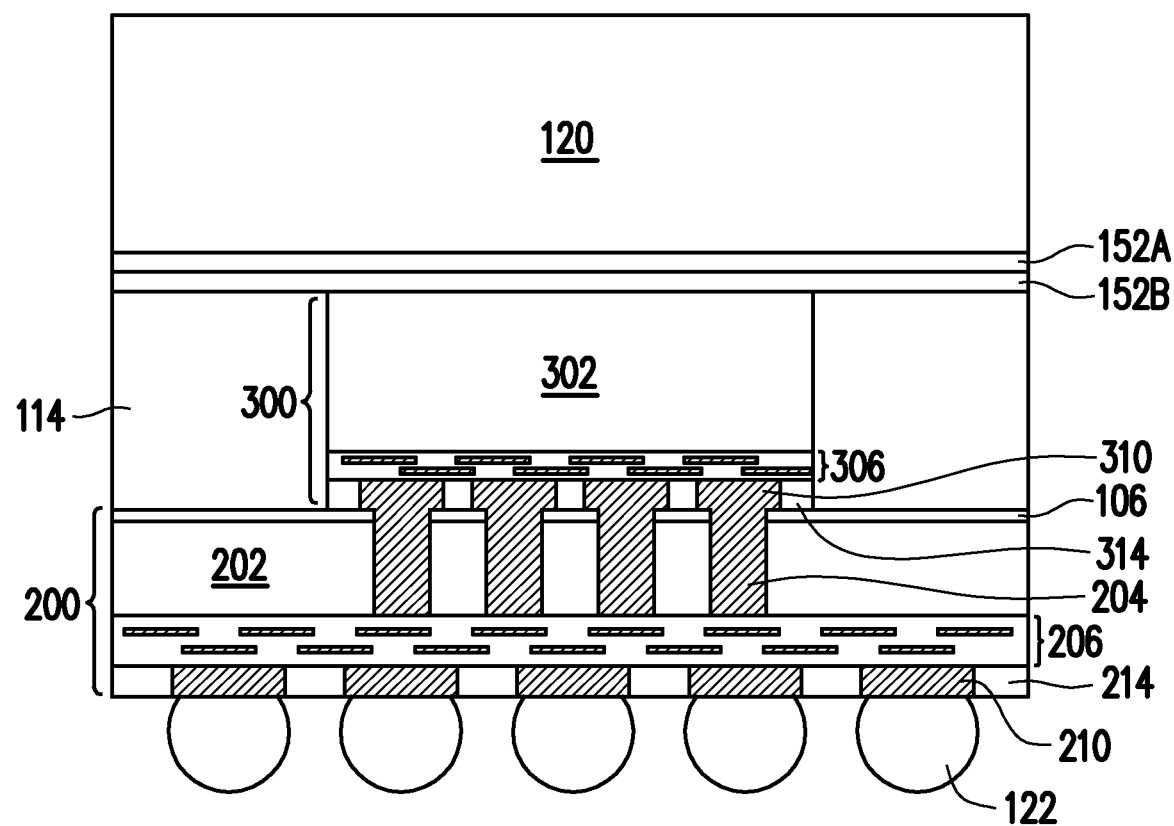
FIG. 11 illustrates a cross-sectional view of a semiconductor package in accordance with some embodiments.

FIG. 11 illustrates a cross-sectional view of a semiconductor package 710 according to some alternate embodiments. The semiconductor package 710 may be similar to the semiconductor package 700 where like reference numerals indicate like elements formed using like processes. For example, in the semiconductor package 710, the substrate 120 is bonded to the die 300 with the dielectric bonding layers 152A and 152B. In semiconductor package 710, the heat dissipation features 112 are omitted, and the die 200 may be wider than and extend laterally past the die 300.

Figure 12:
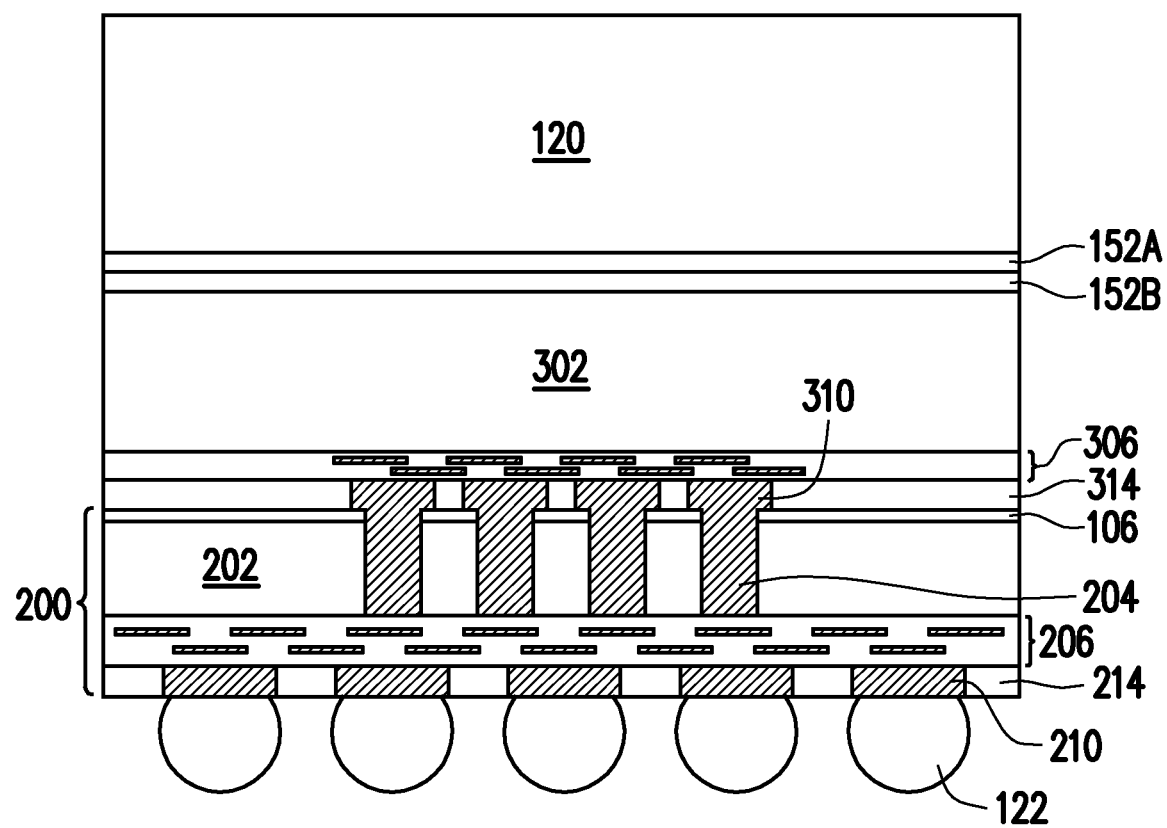
FIG. 12 illustrates a cross-sectional view of a semiconductor package in accordance with some embodiments.

FIG. 12 illustrates a cross-sectional view of a semiconductor package 720 according to some alternate embodiments. The semiconductor package 720 may be similar to the semiconductor package 700 where like reference numerals indicate like elements formed using like processes. For example, in the semiconductor package 720, the substrate 120 is bonded to the die 300 with the dielectric bonding layers 152A and 152B. In semiconductor package 720, the heat dissipation features 112 are omitted, and the die 200 has a same width as and is coterminous with the die 300.

In accordance with some embodiments, stacked dies (e.g., a first die bonded to a second die) are encapsulated in an insulating material, and a substrate is bonded to a backside of the second die and the insulating material. The substrate may provide structural support and heat dissipation. In some embodiments, the substrate is bonded using metal-to-metal bonding, which improves the heat dissipation in the completed package and improves adhesion between the substrate and the second die. In other embodiments, the substrate is bonded using another bonding configuration (e.g., with or without intervening dielectric bonding layers).

In some embodiments, a device package includes a first die directly bonded to a second die at an interface, wherein the interface comprises a conductor-to-conductor bond; an encapsulant surrounding the first die and the second die; a plurality of through vias extending through the encapsulant, wherein the plurality of through vias are disposed adjacent the first die and the second die; a plurality of thermal vias extending through the encapsulant, wherein the plurality of thermal vias are disposed on a surface of the second die and adjacent the first die; and a redistribution structure electrically connected to the first die, the second die, and the plurality of through vias. Optionally, in some embodiments, the first die further comprises: a semiconductor substrate, wherein a dielectric layer of the second die is directly bonded to the semiconductor substrate at the interface; and a through substrate via extending through the semiconductor substrate, wherein a contact pad of the second die is directly bonded to the through substrate via at the interface. Optionally, in some embodiments, the through substrate via electrically connects the second die to the redistribution structure. Optionally, in some embodiments, a dielectric layer of the first die is directly connected to a dielectric layer of the second die at the interface, and wherein a contact pad of the first die is directly connected to a contact pad of the second die at the interface. Optionally, in some embodiments, the first die comprises a through via extending through a semiconductor substrate, wherein the through via extends higher than the semiconductor substrate. Optionally, in some embodiments, the device package further comprises a passivating dielectric layer disposed over the second die and along sidewalls of the first die. Optionally, in some embodiments, the passivating dielectric layer is disposed between a bottom surface of the plurality of thermal vias and a top surface of the second die. Optionally, in some embodiments, the device package further comprises a contact pad on the through via and the passivating dielectric layer, wherein the contact pad electrically connects the through via to the redistribution structure. Optionally, in some embodiments, the plurality of thermal vias is electrically isolated from any active devices in the first die and the second die. Optionally, in some embodiments, the plurality of thermal vias is electrically connect to an active device in the first die.

In some embodiments, a package includes a first die bonded to a second die, wherein a backside of the first die is directly bonded to a front side of the second die; an encapsulant encapsulating the first die and the second die; a redistribution structure electrically connected to the first die and the second die; a plurality of thermal vias extending from a surface of the first die to a surface of the encapsulant opposite the redistribution structure; and a plurality of through vias extending from the redistribution structure to the surface of the encapsulant opposite the redistribution structure. Optionally, in some embodiments, the first die comprises: a semiconductor substrate directly bonded to a dielectric layer of the second die; and a through via extending through the semiconductor substrate, wherein a contact pad of the second die is directly bonded to the through via. Optionally, in some embodiments, each of the plurality of thermal vias comprise a seed layer on the backside of the first die. Optionally, in some embodiments, the plurality of thermal vias extend past sidewalls of the second die in a planar view. Optionally, in some embodiments, the plurality of through vias encircles the first die and the second die in a planar view.

In some embodiments, a method includes hybrid bonding a first die to a second die; depositing a seed layer over and along sidewalls of the first die and the second die; plating a plurality of thermal vias on a surface of the seed layer over the first die; encapsulating the first die, the second die, and the plurality of thermal vias in an encapsulant; planarizing the encapsulant to expose the second die and the plurality of thermal vias; and forming a redistribution structure on an opposing side of the second die as the first die. Optionally, in some embodiments, the method further includes prior to hybrid bonding the first die to the second die, attaching the first die to a carrier, wherein the seed layer is deposited over the carrier; and plating a plurality of through vias on a surface of the seed layer over the carrier. Optionally, in some embodiments, hybrid bonding the first die to the second die comprises: directly bonding a dielectric layer of the second die to a semiconductor substrate of the first die; and directly bonding a contact pad in the dielectric layer of the second die to a through via extending through the semiconductor substrate of the first die. Optionally, in some embodiments, the method further comprises prior to forming the redistribution structure, removing the first die and the second die from a first carrier; and attaching a second carrier to a side of the second die opposite the first die. Optionally, in some embodiments, the method further comprises after plating the plurality of thermal vias, removing the seed layer from sidewalls of the first die, sidewalls of the second die, and a top surface of the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
a first die;
a second die over the first die and bonded to the first die at an interface, wherein the interface between the first die and the second die comprises a metal-to-metal bond;
an insulating material surrounding the second die;
a first insulating bonding layer over and physically contacting the second die and the insulating material; and
a semiconductor substrate bonded to the first insulating bonding layer by a second insulating bonding layer, wherein the second insulating bonding layer extends continuously from the first insulating bonding layer to the semiconductor substrate.

2. The device package according to claim 1, wherein the interface between the second die and the first die further comprises a dielectric-to-dielectric bond.

3. The device package according to claim 1 further comprising a heat dissipation feature over the first die and adjacent to the second die, wherein the insulating material surrounds the heat dissipation feature.

4. The device package according to claim 3, wherein the heat dissipation feature is a dummy silicon die that is directly bonded to the first die.

5. The device package according to claim 3, wherein the heat dissipation feature is a silicon ring surrounding the second die.

6. The device package according to claim 3, wherein the first die further comprises:
a substrate; and
through vias extending through the substrate, wherein the through vias are directly bonded to bond pads of the second die, wherein the through vias extend above the substrate, and the first die further comprising a third insulating bonding layer around upper portions of the through vias, wherein the third insulating bonding layer is directly bonded to a fourth insulating bonding layer of the second die.

7. The device package according to claim 6, wherein the heat dissipation feature is directly bonded to the third insulating bonding layer by dielectric-to-dielectric bonding.

8. A device package comprising:
a first die comprising a first semiconductor substrate;
a second die over and bonded to the first die at an interface, wherein the interface comprises a metal-to-metal bond;
a first insulating bonding layer over and physically contacting a second semiconductor substrate of the second die; and
a third semiconductor substrate bonded to the first insulating bonding layer by a second insulating bonding layer, wherein the second insulating bonding layer physically contacts the third semiconductor substrate and the first insulating bonding layer.

9. The device package of claim 8, wherein the first semiconductor substrate and the second semiconductor substrate are co-terminus.

10. The device package of claim 9, wherein the second semiconductor substrate and the third semiconductor substrate are co-terminus.

11. The device package of claim 8, wherein the first die further comprises conductive vias extending through the first semiconductor substrate and physically contacting bond pads of the second die.

12. The device package of claim 11, wherein the first die further comprises a third insulating bonding layer on the first semiconductor substrate and around portions of the conductive vias that protrude from the first semiconductor substrate.

13. The device package of claim 12, wherein the second die further comprises a fourth insulating bonding layer around the bond pads of the second die, wherein the third insulating bonding layer physically contacts the fourth insulating bonding layer.

14. The device package of claim 8 further comprising an insulating material surrounding the second die, wherein the first insulating bonding layer physically contacts the insulating material.

15. A device package comprising:
a first integrated circuit die;
a second integrated circuit die bonded to the first integrated circuit die at an interface, wherein the interface comprises a metal-to-metal bond and a dielectric-to-dielectric bond;
a first conductive bonding structure contacting the second integrated circuit die, wherein the first conductive bonding structure comprises a first plurality of stacked metal layers; and
a semiconductor substrate bonded to the first conductive bonding structure by a second conductive bonding structure, wherein the first conductive bonding structure and the second conductive bonding structure are directly bonded together.

16. The device package of claim 15, wherein the second conductive bonding structure comprises a second plurality of stacked metal layers.

17. The device package of claim 15 further comprising:
an insulating material surrounding the second integrated circuit die, wherein the first conductive bonding structure contacts the insulating material.

18. The device package of claim 17 further comprising a heat dissipation feature extending through the insulating material and bonded to the first integrated circuit die.

19. The device package of claim 18, wherein the heat dissipation feature is a dummy semiconductor die.

20. The device package of claim 18, wherein the heat dissipation feature is a silicon ring surrounding the second integrated circuit die.

* * * * *